(12) United States Patent
Yamazaki et al.

(10) Patent No.: US 9,269,920 B2
(45) Date of Patent: Feb. 23, 2016

(54) LIGHT-EMITTING ELEMENT

(71) Applicant: Semiconductor Energy Laboratory Co., Ltd., Atsugi-shi, Kanagawa-ken (JP)

(72) Inventors: Shunpei Yamazaki, Setagaya (JP); Satoshi Seo, Sagamihara (JP); Satoko Shitagaki, Isehara (JP); Nobuharu Ohsawa, Tochigi (JP); Hideko Inoue, Atsugi (JP); Hiroshi Kadoma, Sagamihara (JP); Harue Osaka, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/504,826

(22) Filed: Oct. 2, 2014

(65) Prior Publication Data

US 2015/0021579 A1    Jan. 22, 2015

Related U.S. Application Data

(62) Division of application No. 13/429,560, filed on Mar. 26, 2012, now Pat. No. 8,853,680.

(30) Foreign Application Priority Data

Mar. 30, 2011    (JP) .................................. 2011-074272

(51) Int. Cl.
*H01L 29/08* (2006.01)
*H01L 21/00* (2006.01)
(Continued)

(52) U.S. Cl.
CPC .......... *H01L 51/504* (2013.01); *H01L 51/0061* (2013.01); *H01L 51/0072* (2013.01);
(Continued)

(58) Field of Classification Search
USPC ........... 257/13, 40, 66, 72, 79–103, 223, 227, 257/291, 292, 439, 443, 642–643, 655, 759, 257/918, E27.1, E27.125, E27.112, 257/E29.117, E29.145, E29.147, E29.151, 257/E29.182, E29.202, E29.273–E29.299, 257/E29.314, E29.32, E23.016, E21.211, 257/E51.018–E51.022, E33.001–E33.077, 257/E33.054, E25.028, E25.032, 257/E51.001–E51.052, E25.008–E25.009; 438/82, 99, 149, 486, 22–47, 69, 493, 438/503, 507, 956
See application file for complete search history.

(56) References Cited

U.S. PATENT DOCUMENTS 5,409,783 A    4/1995    Tang et al.
5,420,288 A    5/1995    Ohta et al.
(Continued)

FOREIGN PATENT DOCUMENTS

CN    001447629 A    10/2003
CN    001656853 A    8/2005
(Continued)

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
(Continued)

*Primary Examiner* — Su C Kim
*Assistant Examiner* — Junaiden Mirsalahuddin
(74) *Attorney, Agent, or Firm* — Eric J. Robinson; Robinson Intellectual Property Law Office, P.C.

(57) ABSTRACT

A light-emitting element having extremely high efficiency of approximately 25% is provided. The light-emitting element includes a light-emitting layer which contains a phosphorescent guest, an n-type host, and a p-type host, where the light-emitting layer is interposed between an n-type layer including the n-type host and a p-type layer including the p-type host, and where the n-type host and the p-type host are able to form an exciplex in the light-emitting layer. The light-emitting element exhibits an extremely high emission efficiency (power efficiency of 74.3 lm/W, external quantum efficiency of 24.5%, energy efficiency of 19.3%) at a low driving voltage (2.6 V) at which luminance of 1200 cd/m$^2$ is attainable.

15 Claims, 10 Drawing Sheets

(51) Int. Cl.
*H01L 51/50* (2006.01)
*H01L 27/32* (2006.01)
*H01L 51/00* (2006.01)

(52) U.S. Cl.
CPC ........ *H01L51/0074* (2013.01); *H01L 51/0085* (2013.01); *H01L 51/5016* (2013.01); *H01L 27/3209* (2013.01); *H01L 51/0059* (2013.01); *H01L 51/0071* (2013.01); *H01L 51/5056* (2013.01); *H01L 51/5072* (2013.01); *H01L 2251/5346* (2013.01); *H01L 2251/5376* (2013.01); *H01L 2251/5384* (2013.01)

(56) References Cited

U.S. PATENT DOCUMENTS

| | | | |
|---|---|---|---|
| 5,597,890 | A | 1/1997 | Jenekhe |
| 5,597,925 | A | 1/1997 | Ohta et al. |
| 5,610,309 | A | 3/1997 | Ohta et al. |
| 5,656,401 | A | 8/1997 | Ohta et al. |
| 5,709,492 | A | 1/1998 | Yasunaga et al. |
| 6,097,147 | A | 8/2000 | Baldo et al. |
| 6,863,997 | B2 | 3/2005 | Thompson et al. |
| 6,869,695 | B2 | 3/2005 | Thompson et al. |
| 6,951,694 | B2 | 10/2005 | Thompson et al. |
| 7,175,922 | B2 | 2/2007 | Jarikov et al. |
| 7,183,010 | B2 | 2/2007 | Jarikov |
| 7,355,340 | B2 | 4/2008 | Shitagaki et al. |
| 7,553,557 | B2 | 6/2009 | Thompson et al. |
| 7,572,522 | B2 | 8/2009 | Seo et al. |
| 7,943,925 | B2 | 5/2011 | Yamazaki |
| 8,080,934 | B2 | 12/2011 | Kido et al. |
| 8,247,086 | B2 | 8/2012 | Inoue et al. |
| 8,507,695 | B2 | 8/2013 | Nomura et al. |
| 9,040,719 | B2 | 5/2015 | Nomura et al. |
| 2003/0124381 | A1 | 7/2003 | Thompson et al. |
| 2003/0175553 | A1 | 9/2003 | Thompson et al. |
| 2003/0189401 | A1 | 10/2003 | Kido et al. |
| 2004/0076853 | A1 | 4/2004 | Jarikov |
| 2004/0222739 | A1 | 11/2004 | Chen et al. |
| 2005/0003232 | A1 | 1/2005 | Shitagaki et al. |
| 2005/0048310 | A1 | 3/2005 | Cocchi et al. |
| 2005/0106415 | A1 | 5/2005 | Jarikov et al. |
| 2005/0142381 | A1* | 6/2005 | Lyu ............... C07F 15/0033 428/690 |
| 2005/0196775 | A1 | 9/2005 | Swager et al. |
| 2006/0024526 | A1 | 2/2006 | Thompson et al. |
| 2006/0134464 | A1 | 6/2006 | Nariyuki |
| 2006/0228577 | A1 | 10/2006 | Nagara |
| 2007/0182317 | A1 | 8/2007 | Kido et al. |
| 2007/0196689 | A1* | 8/2007 | Ragini ............... C09K 11/06 428/690 |
| 2007/0222374 | A1 | 9/2007 | Egawa et al. |
| 2007/0244320 | A1 | 10/2007 | Inoue et al. |
| 2007/0247829 | A1 | 10/2007 | Fiedler et al. |
| 2008/0160345 | A1 | 7/2008 | Inoue et al. |
| 2008/0217604 | A1 | 9/2008 | Yokoyama et al. |
| 2008/0286604 | A1 | 11/2008 | Inoue et al. |
| 2009/0102368 | A1 | 4/2009 | Shitagaki et al. |
| 2009/0191427 | A1* | 7/2009 | Liao ............... H01L 51/5096 428/690 |
| 2009/0322217 | A1 | 12/2009 | Inoue et al. |
| 2010/0052527 | A1 | 3/2010 | Ikeda et al. |
| 2010/0145044 | A1 | 6/2010 | Inoue et al. |
| 2010/0184942 | A1 | 7/2010 | Chen et al. |
| 2011/0001146 | A1 | 1/2011 | Yamazaki et al. |
| 2011/0073844 | A1* | 3/2011 | Pieh ............... H01L 51/5036 257/40 |
| 2011/0204353 | A1 | 8/2011 | Yamazaki |
| 2011/0210316 | A1 | 9/2011 | Kadoma et al. |
| 2011/0215714 | A1 | 9/2011 | Seo et al. |
| 2012/0098417 | A1 | 4/2012 | Inoue et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0242219 | A1 | 9/2012 | Seo et al. |
| 2012/0256535 | A1 | 10/2012 | Seo et al. |
| 2012/0267618 | A1 | 10/2012 | Monkman et al. |
| 2013/0048964 | A1 | 2/2013 | Takeda et al. |
| 2015/0255728 | A1 | 9/2015 | Nomura et al. |

FOREIGN PATENT DOCUMENTS

| | | |
|---|---|---|
| CN | 101442107 A | 5/2009 |
| CN | 102190653 A | 9/2011 |
| EP | 0669387 A | 8/1995 |
| EP | 1351558 A | 10/2003 |
| EP | 1359790 A | 11/2003 |
| EP | 2363398 A | 9/2011 |
| EP | 2366753 A | 9/2011 |
| JP | 06-065569 A | 3/1994 |
| JP | 06-092947 A | 4/1994 |
| JP | 06-107648 A | 4/1994 |
| JP | 06-145658 A | 5/1994 |
| JP | 07-085972 A | 3/1995 |
| JP | 07-288184 A | 10/1995 |
| JP | 2000-133453 A | 5/2000 |
| JP | 2003-272860 A | 9/2003 |
| JP | 2003-347058 A | 12/2003 |
| JP | 2004-281274 A | 10/2004 |
| JP | 2004-335442 A | 11/2004 |
| JP | 2005-514754 | 5/2005 |
| JP | 2007-070361 A | 3/2007 |
| JP | 2007-073620 A | 3/2007 |
| JP | 2010-080435 A | 4/2010 |
| JP | 2010-135689 A | 6/2010 |
| JP | 2010-168396 A | 8/2010 |
| JP | 4522862 | 8/2010 |
| JP | 2011-153269 A | 8/2011 |
| JP | 2011-201869 A | 10/2011 |
| JP | 2011-204673 A | 10/2011 |
| JP | 2011-216628 A | 10/2011 |
| JP | 2012-004526 A | 1/2012 |
| JP | 2013-509670 | 3/2013 |
| KR | 2004-0019177 A | 3/2004 |
| KR | 2007-0042924 A | 4/2007 |
| KR | 2010-0027073 A | 3/2010 |
| KR | 2011-0099173 A | 9/2011 |
| KR | 2011-0099645 A | 9/2011 |
| TW | 200932039 | 7/2009 |
| TW | 201107289 | 3/2011 |
| WO | WO-00/70655 | 11/2000 |
| WO | WO-03/059015 | 7/2003 |
| WO | WO-2004/043937 | 5/2004 |
| WO | WO-2005/022660 | 3/2005 |
| WO | WO-2009/051248 | 4/2009 |
| WO | WO-2010/085676 | 7/2010 |
| WO | WO-2011/042443 | 4/2011 |

OTHER PUBLICATIONS

Choong.V et al., "Organic Light-Emitting Diodes With a Bipolar Transport Layer", Appl. Phys. Lett. (Applied Physics Letters), Jul. 12, 1999, vol. 75, No. 2, pp. 172-174.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", Appl. Phys. Lett. (Applied Physics Letters), Feb. 9, 1998, vol. 72, No. 6, pp. 636-638.

Kondakova.M et al., "High-efficiency, low-voltage phosphorescent organic light-emitting diode devices with mixed host", J. Appl. Phys. (Journal of Applied Physics), 2008, vol. 104, pp. 094501-1-094501-17.

Wang.J et al., "Exciplex Electroluminescence from Organic Bilayer Devices Composed of Triphenyldiamine and Quinoxaline Derivatives", Adv. Mater. (Advanced Materials), Feb. 1, 1998, vol. 10, No. 3, pp. 230-233.

International Search Report (Application No. PCT/JP2012/055891) Dated May 29, 2012.

Written Opinion (Application No. PCT/JP2012/055891) Dated May 29, 2012.

(56) References Cited

OTHER PUBLICATIONS

Seo.J at al., "Efficient blue-green organic light-emitting diodes based on heteroleptic tris-cyclometalated iridium(III) complexes", Thin Solid Films, 2009, vol. 517, No. 5, pp. 1807-1810.

Hino.Y et al., "Red Phosphorescent Organic Light-Emitting Diodes Using Mixture System of Small-Molecule and Polymer Host", Jpn. J. Appl. Phys. (Japanese Journal of Applied Physics), 2005, vol. 44, No 4B, pp. 2790-2794.

Tsuboyama.A at al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Adachi.C et al., "Nearly 100% Internal Phosphorescence Efficiency in an Organic Light Emitting Device", J. Appl. Phys. (Journal of Applied Physics), Nov. 15, 2001, vol. 90, No. 10, pp. 5048-5051.

Markham.J et al., "High-efficiency green phosphorescence from spin-coated single-layer dendrimer light-emitting diodes", Appl. Phys. Lett. (Applied Physics Letters), Apr. 15, 2002, vol. 80, No. 15, pp. 2645-2647.

Fujita.M et al., "Reduction of operating voltage in organic light-emitting diode by corrugated photonic crystal structure", Appl. Phys. Lett. (Applied Physics Letters), Dec. 6, 2004, vol. 85, No. 23, pp. 5769-5771.

Baldo.M et al., "Prospects for Electrically Pumped Organic Lasers", Phys. Rev. B (Physical Review B), Jul. 1, 2002, vol. 66, pp. 035321-1-035321-16.

Gu.G et al., "Transparent Organic Light Emitting Devices", Appl. Phys. Lett. (Applied Physics Letters), May 6, 1996, vol. 68, No. 19, pp. 2606-2608.

Baldo.M et al., "Highly Efficient Phosphorescent Emission From Organic Electroluminescent Devices", Nature, Sep. 10, 1998, vol. 395, pp. 151-154.

King.K et al., "Excited-state properties of a triply ortho-metalated iridium(III) complex", J. Am. Chem. Soc. (Journal of the American Chemical Society), Mar. 1, 1985, vol. 107, No. 5, pp. 1431-1432, ACS(American Chemical Society).

* cited by examiner

LIGHT-EMITTING ELEMENT

TECHNICAL FIELD

The present invention relates to light-emitting elements using an organic electroluminescence (EL) phenomenon (hereinafter such light-emitting elements are also referred to as organic EL elements).

BACKGROUND ART

Organic EL elements have been actively researched and developed. In a fundamental structure of the organic EL element, a layer including a luminescent organic compound (hereinafter also referred to as light-emitting layer) is interposed between a pair of electrodes. The organic EL element has attracted attention as a next-generation flat panel display element owing to characteristics such as feasibility of being thinner and lighter, high speed response to input signals, and capability of direct current low voltage driving. In addition, a display using such a light-emitting element has a feature that it is excellent in contrast and image quality, and has a wide viewing angle. Further, being a planar light source, the organic EL element has been attempted to be applied as a light source such as a backlight of a liquid crystal display and a lighting device.

The emission mechanism of the organic EL element is of a carrier-injection type. That is, by application of voltage with a light-emitting layer interposed between electrodes, electrons and holes injected from the electrodes are recombined to make a light-emitting substance excited, and light is emitted when the excited state relaxes to the ground state. There can be two types of the excited states: a singlet excited state and a triplet excited state. Further, the statistical generation ratio of the singlet excited state to the triplet excited state in a light-emitting element is considered to be 1:3.

In general, the ground state of a light-emitting organic compound is a singlet state. Therefore, light emission from the singlet excited state is referred to as fluorescence because it is caused by electron transition between the same spin multiplicities. On the other hand, light emission from the triplet excited state is referred to as phosphorescence where electron transition occurs between different spin multiplicities. Here, in a compound emitting fluorescence (hereinafter referred to as fluorescent compound), in general, phosphorescence is not observed at room temperature, and only fluorescence is observed. Accordingly, the internal quantum efficiency (the ratio of generated photons to injected carriers) in a light-emitting element including a fluorescent compound is assumed to have a theoretical limit of 25% based on the above ratio of the singlet excited state to the triplet excited state ($=1:3$).

On the other hand, when a compound emitting phosphorescence (hereinafter referred to as phosphorescent compound) is used, the internal quantum efficiency can be theoretically increased to 100%. That is, higher emission efficiency can be obtained than using a fluorescent compound. For these reasons, a light-emitting element including a phosphorescent compound has been actively developed in recent years in order to achieve a high-efficiency light-emitting element.

As the phosphorescent compound, an organometallic complex that has iridium or the like as a central metal has particularly attracted attention owing to their high phosphorescence quantum efficiency; for example, an organometallic complex that has iridium as a central metal is disclosed as a phosphorescent material in Patent Document 1.

When a light-emitting layer of a light-emitting element is formed using a phosphorescent compound described above, in order to suppress concentration quenching or quenching due to triplet-triplet annihilation in the phosphorescent compound, the light-emitting layer is often formed such that the phosphorescent compound is dispersed in a matrix of another compound. Here, the compound serving as the matrix is called a host, and the compound dispersed in the matrix, such as a phosphorescent compound, is called a guest.

There are generally given several elementary processes for light emission in such a light-emitting element using a phosphorescent compound as a guest, and descriptions of the elementary processes are given below.

(1) The case where an electron and a hole are recombined in a guest molecule, and the guest molecule is excited (direct recombination process).

(1-1) When the excited state of the guest molecule is a triplet excited state, the guest molecule emits phosphorescence.

(1-2) When the excited state of the guest molecule is a singlet excited state, the guest molecule in the singlet excited state undergoes intersystem crossing to a triplet excited state and emits phosphorescence.

In other words, in the direct recombination process in (1), as long as the efficiency of intersystem crossing and the phosphorescence quantum efficiency of the guest molecule are high, high emission efficiency can be obtained.

(2) The case where an electron and a hole are recombined in a host molecule and the host molecule is put in an excited state (energy transfer process).

(2-1) When the excited state of the host molecule is a triplet excited state and the triplet excitation energy level (T1 level) of the host molecule is higher than that of the guest molecule, excitation energy is transferred from the host molecule to the guest molecule, and thus the guest molecule is put in a triplet excited state. The guest molecule in the triplet excited state emits phosphorescence. Note that it is necessary to consider the reverse energy transfer to the triplet excitation energy level (T1 level) of the host molecules. Therefore, the T1 level of the host molecules must be higher than that of the guest molecule.

(2-2) When the excited state of the host molecule is a singlet excited state and the S1 level of the host molecule is higher than the S1 level and T1 level of the guest molecule, excitation energy is transferred from the host molecule to the guest molecule, and thus, the guest molecule is put in a singlet excited state or a triplet excited state. The guest molecule in the triplet excited state emits phosphorescence. In addition, the guest molecule in the singlet excited state undergoes intersystem crossing to a triplet excited state, and emits phosphorescence.

In other words, in the energy transfer process in (2), it is significantly important to efficiently transfer not only the triplet excitation energy but also the singlet excitation energy of the host molecules to the guest molecule.

In view of the above-described energy transfer processes, before the excitation energy of the host molecule is transferred to the guest molecule, when the host molecule itself is deactivated by emitting the excitation energy as light or heat, the emission efficiency is decreased.

<Energy Transfer Process>

Energy transfer processes between molecules are described below in details.

First, as a mechanism of energy transfer between molecules, the following two mechanisms are proposed. A molecule providing excitation energy is referred to as host molecule, while a molecule receiving excitation energy is referred to as guest molecule.

<<Förster Mechanism (Dipole-Dipole Interaction)>>

Förster mechanism (also referred to as Förster resonance energy transfer) does not require direct contact between molecules for energy transfer. Through a resonant phenomenon of dipolar oscillation between a host molecule and a guest molecule, energy transfer occurs. By the resonant phenomenon of dipolar oscillation, the host molecule provides energy to the guest molecule, and thus, the host molecule is put in a ground state and the guest molecule is put in an excited state. The rate constant $k_h{}^*{}_{\to g}$ of Förster mechanism is expressed by Formula (1).

[Formula (1)]

$$k_{h^* \to g} = \frac{9000c^4 K^2 \phi \ln 10}{128\pi^5 n^4 N \tau R^6} \int \frac{f_h'(v)\varepsilon_g(v)}{v^4} dv \quad (1)$$

In Formula (1), v denotes a frequency, $f_h'(v)$ denotes a normalized emission spectrum of a host molecule (a fluorescent spectrum in energy transfer from a singlet excited state, and a phosphorescent spectrum in energy transfer from a triplet excited state), $\varepsilon_g(v)$ denotes a molar absorption coefficient of a guest molecule, N denotes Avogadro's number, n denotes a refractive index of a medium, R denotes an intermolecular distance between the host molecule and the guest molecule, τ denotes a measured lifetime of an excited state (fluorescence lifetime or phosphorescence lifetime), c denotes the speed of light, φ denotes a luminescence quantum efficiency (a fluorescence quantum efficiency in energy transfer from a singlet excited state, and a phosphorescence quantum efficiency in energy transfer from a triplet excited state) of the host molecule, and $K^2$ denotes a coefficient (0 to 4) of orientation of a transition dipole moment between the host molecule and the guest molecule. Note that $K^2 = 2/3$ in random orientation.

<<Dexter Mechanism (Electron Exchange Interaction)>>

In Dexter mechanism (also referred to as Dexter electron transfer), a host molecule and a guest molecule are close to a contact effective range where their orbitals overlap, and the host molecule in an excited state and the guest molecule in a ground state exchange their electrons, which leads to energy transfer. The rate constant $k_h{}^*{}_{\to g}$ of Dexter mechanism is expressed by Formula (2).

[Formula (2)]

$$k_{h^* \to g} = \left(\frac{2\pi}{h}\right) K^2 \exp\left(-\frac{2R}{L}\right) \int f_h'(v)\varepsilon_g'(v) dv \quad (2)$$

In Formula (2), h denotes a Planck constant, K denotes a constant having an energy dimension, v denotes a frequency, $f_h'(v)$ denotes a normalized emission spectrum of a host molecule (a fluorescent spectrum in energy transfer from a singlet excited state, and a phosphorescent spectrum in energy transfer from a triplet excited state), $\varepsilon_g'(v)$ denotes a normalized absorption spectrum of a guest molecule, L denotes an effective molecular radius, and R denotes an intermolecular distance between the host molecule and the guest molecule.

Here, the efficiency of energy transfer from the host molecule to the guest molecule (energy transfer efficiency $\Phi_{ET}$) is thought to be expressed by Formula (3). In the formula, $k_r$ denotes a rate constant of a light-emission process of the host molecule (fluorescence in energy transfer from the host molecule in a singlet excited state, and phosphorescence in energy transfer from the host molecule in a triplet excited state), $k_n$ denotes a rate constant of a non-light-emission process (thermal deactivation or intersystem crossing), and τ denotes a measured lifetime of the excited state of the host molecule.

[Formula (3)]

$$\Phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

First, according to Formula (3), it is found that the energy transfer efficiency $\Phi_{ET}$ can be increased by further increasing the rate constant $k_h{}^*{}_{\to g}$ of energy transfer as compared with another competing rate constant $k_r + k_n (=1/\tau)$. Then, in order to increase the rate constant $k_h{}^*{}_{\to g}$ of energy transfer, based on Formulae (1) and (2), in Förster mechanism and Dexter mechanism, it is preferable that an emission spectrum of a host molecule (a fluorescent spectrum in energy transfer from a singlet excited state, and a phosphorescent spectrum in energy transfer from a triplet excited state) largely overlap with an absorption spectrum of a guest molecule (an energy difference between a triplet excited state and a ground state in the usual case of phosphorescence).

REFERENCE

[Patent Document 1] PCT International Publication No. 2000/070655

DISCLOSURE OF INVENTION

As mentioned above, it is possible to obtain a highly efficient light-emitting element by using a phosphorescent compound. The energy transfer process teaches that considerable overlapping of an emission spectrum of a host molecule and an absorption spectrum of a guest molecule is required to achieve a highly efficient light-emitting element. Furthermore, the T1 level of the host molecule should be higher than that of the guest molecule to suppress the reverse energy transfer from the T1 level of the guest molecule to the T1 level of the host molecule.

Phosphorescent organometallic complexes (e.g., iridium complexes) used as a phosphorescent guest molecule generally have an absorption originating from the triplet MLCT (metal-to-ligand charge transfer) transition in a relatively long wavelength region. Their excitation spectra suggest that this absorption in a long wavelength region (mainly located at around 450 nm) significantly contributes to the emission of the guest molecule. Hence, it is preferable that this absorption in a long wavelength region fairly overlaps with the phosphorescent spectra of the host molecule. This is because such a large overlapping allows the energy transfer from the triplex exited state of the host molecule to efficiently take place, resulting in an efficient formation of the triplet excited state of the guest molecule.

On the other hand, the fluorescent spectrum corresponding to the S1 level is observed in a considerably short wavelength region compared with the phosphorescent spectrum corresponding to the T1 level because the S1 level of the host molecule is higher than the T1 level. This means the decease in the overlapping of the fluorescent spectrum of the host molecule with the absorption (resulting from the triplet MLCT transition) of the guest molecule, which appears in a long wavelength region. Therefore, it is impossible to sufficiently utilize the energy transfer from the singlet excited state of the host molecule to the guest molecule.

That is, the traditional phosphorescent light-emitting elements have a quite low probability that the energy transfer from the singlet excited state of the host molecule to the phosphorescent guest molecule occurs to form the singlet excited state of the guest molecule which is subsequently transformed to the triplet excited state by the intersystem crossing.

The present invention is made in view of these problems, and one embodiment of the present invention provides a light-emitting element based on a novel principle. In addition, one embodiment of the present invention provides a light-emitting element having high external quantum efficiency.

One embodiment of the present invention is a light-emitting element which includes a light-emitting layer containing a phosphorescent compound (a guest), a first organic compound, and a second organic compound between a pair of electrodes (a first electrode and a second electrode); a layer containing the first organic compound but not containing the second organic compound (a first layer) between the light-emitting layer and the first electrode; and a layer containing the second organic compound but not containing the first organic compound (a second layer) between the light-emitting layer and the second electrode.

In the above embodiment, the first organic compound has an electron-transport property superior to a hole-transport property, and the second organic compound has a hole-transport property superior to an electron-transport property. The first organic compound and the second organic compound are materials which form an exciplex (an excited complex). In this structure, the guest is excited through energy transfer from the exciplex to the guest and light emission is obtained from the excited state of the guest. Note that a layer other than the light-emitting layer may be capable of emitting light in response to electric current injection.

It is considered that exciplexes have a small energy difference between the singlet excitation energy and the triplet excitation energy. In other words, the an emission from the singlet excited state and that from the triplet excited state appear in wavelength regions which are very close to each other. Additionally, because emission of exciplexes is usually observed in a longer wavelength region than that of their monomer states, it is possible to increase the overlapping between the absorptions of phosphorescent compounds, which appear in a long wavelength region and originate from the triplet MLCT transition, and the emission of the exciplexes. This means that energy can be efficiently transferred from both of the singlet and triplet states of exciplexes to phosphorescent compounds, which contributes to the improvement in the efficiency of the light-emitting elements.

Moreover, exciplexes do not possess a ground state. Thus, there is no process of the reverse energy transfer from the triplet state of the guest molecule to the exciplex of the host molecules, and reduction in efficiency of the light-emitting element caused by this process can be neglected.

In the specification, according to the features of the electron-transport property or the hole-transport property of the first organic compound and the second organic compound, the first organic compound and the second organic compound are also referred to as an n-type host and a p-type host, respectively. Either the n-type host or the p-type host may be a material which emits fluorescence. The proportions of the n-type host and the p-type host in the light-emitting layer are each preferably 10% or more.

A region in which the proportions of the n-type host and the p-type host change continuously may be provided between the first layer and the light-emitting layer or between the second layer and the light-emitting layer. Note that the proportions of the n-type host and the p-type host in the light-emitting layer may also be set so as to change continuously.

Another embodiment of the present invention is a light-emitting element which includes an n-type host layer including an n-type host, a p-type host layer including a p-type host, and a region containing the n-type host, the p-type host, and a guest between the n-type host layer and the p-type host layer. The n-type host and the p-type host are materials which form an exciplex.

In the aforementioned light-emitting element, it is preferable that the phosphorescent compound be an organometallic complex. It is also preferable that the phosphorescent compound contain iridium. The phosphorescent compound may be contained in the first layer, the second layer, a region between the light-emitting layer and the first layer, or a region between the light-emitting layer and the second layer, besides the light-emitting layer.

In one embodiment of the present invention, the light-emitting layer contains n-type host molecules, p-type host molecules, and guest molecules. Needless to say, the molecules are not necessarily arranged regularly and may be arranged in an almost irregular manner. In particular, when the light-emitting layer is formed as a thin film with a thickness of 50 nm or less, it is preferably amorphous, and thus a combination of materials that are hardly crystallized is preferable. Furthermore, the n-type host layer or the p-type host layer may contain two or more different kinds of compounds.

The light-emitting element according to any of the embodiments of the present invention can be applied to a light-emitting device, an electronic device, and a lighting device.

An appropriate combination of the n-type host and the p-type host forms an exciplex when brought into an excited state. Note that a necessary condition for the exciplex formation is that the HOMO level of the n-type host<the HOMO level of the p-type host<the LUMO level of the n-type host<the LUMO level of the p-type host, but this is not a sufficient condition. For example, $Alq_3$ and NPB satisfy the above condition but do not form an exciplex.

In contrast, in the case where the n-type host and the p-type host can form an exciplex, the guest molecules can be excited also through the process of energy transfer from the singlet and triplet states of the exciplex to the guest molecules as mentioned above, which enables an increase in the emission efficiency compared with the traditional phosphorescent light-emitting elements.

In the case where a light-emitting element has a junction of different layers, an energy gap generated at the interface causes an increase in driving voltage and a decrease in power efficiency (see Patent Document 2). Therefore, it is preferable to minimize the number of junctions of dissimilar materials in a light-emitting element.

In any of the above embodiments, the interface between the light-emitting layer containing a mixture of the n-type host and the p-type host and the n-type host layer serves as a barrier to holes, but hardly serves as an obstacle to electrons. The interface between the light-emitting layer and the p-type host layer serves as a barrier to electrons, but hardly serves as an obstacle to holes. Therefore, electrons and holes are confined in the light-emitting layer or between the n-type host layer and the p-type host layer. As a result, electrons and holes can be prevented from reaching an anode and a cathode, respectively, whereby emission efficiency can be improved. In general, exciplexes provide broad emission spectra. On the other hand, since the guest molecule emits light in the embodiments of the present invention, emission spectra with a small half width can be obtained, which allows the formation of a light-emitting element that is capable of emitting light with excellent color purity.

REFERENCE

[Patent Document 2] U.S. Pat. No. 7,572,522

BEST MODE FOR CARRYING OUT THE INVENTION

Figure 1A:
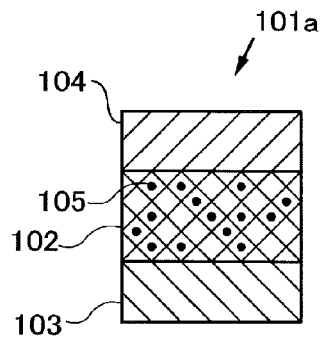
FIGS. 1A to 1I are conceptual diagrams of the present invention.

Embodiments will be described in detail with reference to drawings. Note that the present invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

A light-emitting element 101a which is an example in this embodiment includes an n-type host layer 103 including an n-type host, a p-type host layer 104 including a p-type host, and a layer containing both the n-type host and the p-type host (hereinafter referred to as a light-emitting layer 102) interposed therebetween, as illustrated in FIG. 1A. Guest molecules 105 are dispersed in the light-emitting layer 102.

Figure 1B:
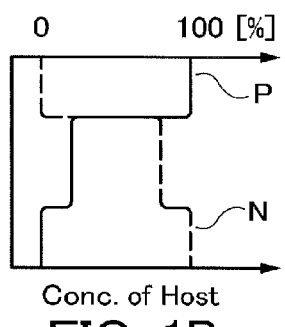

FIG. 1B illustrates distributions of the concentration of the n-type host (denoted by "N" in the diagram) and the concentration of the p-type host (denoted by "P" in the diagram) in the light-emitting element 101a. In the light-emitting layer 102 of the light-emitting element 101a, the concentration of the n-type host is 80% and the concentration of the p-type host is 20%. In other words, in the light-emitting layer 102, the ratio of the n-type host to the p-type host is 4:1. This ratio may be determined in consideration of the transport properties of the n-type host and the p-type host or the like, but it is preferable that the concentrations of the n-type host and the p-type host in the light-emitting layer be each 10% or more.

Figure 1C:
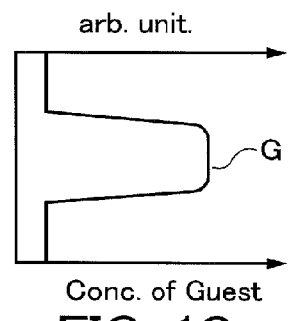

The guest molecules 105 are dispersed in the light-emitting layer 102 as illustrated in FIG. 1C, but the present invention is not limited thereto. The guest molecules 105 may be dispersed in part of the n-type host layer 103 or in part of the p-type host layer 104. Note that "G" in the diagrams represents the concentration distribution of the guest molecules.

In the n-type host layer 103, the concentration of the p-type host is extremely low and is 0.1% or less, and in the p-type host layer 104, the concentration of the n-type host is extremely low and is 0.1% or less. Of course, it is not necessary that the concentrations change drastically at the interface between the light-emitting layer 102 and the n-type host layer 103 and at the interface between the light-emitting layer 102 and the p-type host layer 104.

Figure 1D:
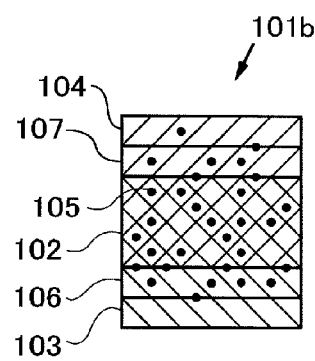

FIG. 1D illustrates an example of another light-emitting element 101b in this embodiment. The light-emitting element 101b includes an n-type host layer 103, a p-type host layer 104, and a light-emitting layer 102 which are similar to those in the light-emitting element 101a. In addition, guest molecules 105 are dispersed in the light-emitting layer 102.

The differences from the light-emitting element 101a are that a region in which the concentration of the n-type host and the concentration of the p-type host change gradually (hereinafter referred to as an n-type transition region 106) is provided between the light-emitting layer 102 and the n-type host layer 103 and that a region in which the concentration of the n-type host and the concentration of the p-type host change gradually (hereinafter referred to as a p-type transition region 107) is provided between the light-emitting layer 102 and the p-type host layer 104.

Note that the light-emitting element 101b does not necessarily include both the n-type transition region 106 and the p-type transition region 107. In some cases, the n-type transition region 106 and the p-type transition region 107 may have a light-emitting function. Thus, the n-type transition region 106 and the p-type transition region 107 may be regarded as light-emitting layers in a broad sense. In that case, the light-emitting layer 102 may be regarded as a main light-emitting layer. The n-type transition region 106 and the p-type transition region 107 may each have a thickness of 1 nm to 50 nm.

Figure 1E:
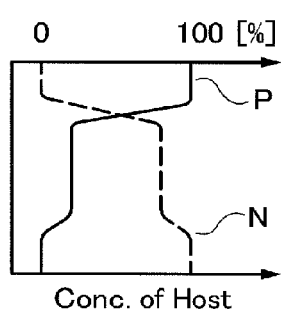
Figure 1F:
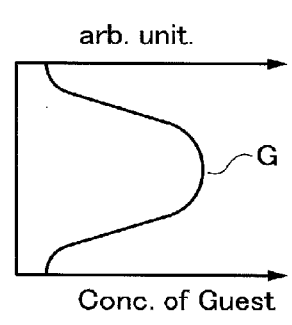

FIG. 1E illustrates distributions of the concentrations of the n-type host and the p-type host, and the concentrations of the n-type host and the p-type host change continuously in the n-type transition region 106 and the p-type transition region 107. In addition, as illustrated in FIG. 1F, the guest molecules 105 may be provided so as to be included not only in the light-emitting layer 102 but also in the n-type transition region 106 and the p-type transition region 107, and furthermore, may be provided so as to be included in part of the n-type host layer 103 and the p-type host layer 104. It is needless to say that the guest molecules 105 may be provided only in the light-emitting layer 102.

Figure 1G:
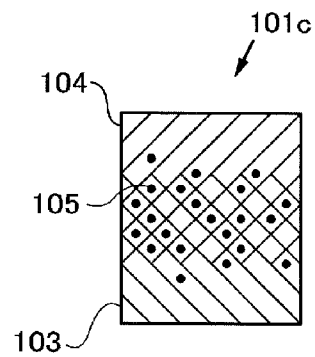
Figure 1H:
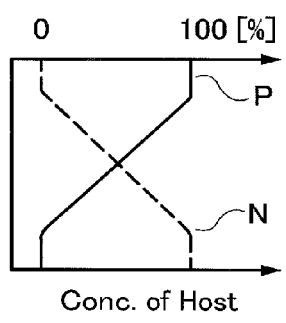

FIG. 1G illustrates another light-emitting element 101c of this embodiment. In the light-emitting element 101c, the concentration of the n-type host and the concentration of the p-type host change continuously in a region sandwiched between the n-type host layer 103 and the p-type host layer 104 as illustrated in FIG. 1H. In this case, it is difficult to define a light-emitting layer (or a main light-emitting layer) as in the light-emitting element 101a and the light-emitting element 101b; however, a region in which the n-type host and the p-type host are mixed and the concentrations of the n-type host and the p-type host are each 10% or more can be regarded as a light-emitting layer in a broad sense.

Figure 1I:
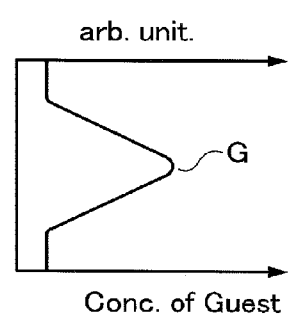

The concentration of the guest may be set so that the guest is included in the light-emitting layer in a broad sense as illustrated in FIG. 1I. Note that, in each of FIGS. 1A to 1I, the p-type host layer 104 is provided over the n-type host layer 103 with the light-emitting layer 102 interposed therebetween. However, this structure is given for convenience, and it is readily appreciated that the reversed structure is also included in the embodiment of the present invention where the n-type host layer 103 is provided over the p-type host layer 104.

Energy levels of the above light-emitting element 101a will be described with reference to FIG. 2A. As stated above, the HOMO levels and the LUMO levels of the n-type host and the p-type host have the following relationship: the HOMO level of the n-type host<the HOMO level of the p-type host<the LUMO level of the n-type host<the LUMO level of the p-type host.

On the other hand, in the light-emitting layer 102 in which the n-type host and the p-type host are mixed, it can be recognized, from a viewpoint of carrier transfer, that the HOMO level is equal to the HOMO level of the p-type host and the LUMO level is equal to the LUMO level of the n-type host because holes and electrons are transferred using the HOMO level of the p-type host and the LUMO level of the n-type host, respectively. As a result, at the interface between the light-emitting layer 102 and the p-type host layer 104, there is a gap between the LUMO levels, which serves as a barrier to electron transfer. Similarly, at the interface between the light-emitting layer 102 and the n-type host layer 103, there is a gap between the HOMO levels, which serves as a barrier to hole transfer.

On the other hand, at the interface between the light-emitting layer 102 and the p-type host layer 104, the HOMO levels are equal and thus there is no barrier to hole transfer, and also at the interface between the light-emitting layer 102 and the n-type host layer 103, the LUMO levels are equal and thus there is no barrier to electron transfer.

As a result, electrons are easily transferred from the n-type host layer 103 to the light-emitting layer 102, but the gap between the LUMO levels of the light-emitting layer 102 and the p-type host layer 104 hinders electron transfer from the light-emitting layer 102 to the p-type host layer 104.

Similarly, holes are easily transferred from the p-type host layer 104 to the light-emitting layer 102, but the gap between the HOMO levels of the light-emitting layer 102 and the n-type host layer 103 hinders hole transfer from the light-emitting layer 102 to the n-type host layer 103. As a result, electrons and holes can be confined in the light-emitting layer 102.

Energy levels of the above light-emitting element 101b will be described with reference to FIG. 2B. Although the HOMO levels and the LUMO levels of the light-emitting layer 102, the n-type host layer 103, and the p-type host layer 104 are the same as those in FIG. 2A, the n-type transition region 106 and the p-type transition region 107 should be noted. In these regions, the concentration of the n-type host and the concentration of the p-type host change continuously.

However, unlike the case where the conduction band and the valence band of an inorganic semiconductor material (e.g., $Ga_xIn_{1-x}N$ (0<x<1)) change continuously with a change in composition, the LUMO level and the HOMO level of a mixed organic compound hardly change continuously. This is because the electrical conduction of an organic compound is hopping conduction which is different from the electrical conduction of an inorganic semiconductor.

For example, as the concentration of the n-type host decreases and the concentration of the p-type host increases, electrons become less likely to be conducted, which is understood to be not because the LUMO level rises continuously but because the probability of transfer decreases due to an increase in distance between the n-type host molecules and because additional energy is necessary for hopping to a LUMO level of the neighboring p-type host that has a higher LUMO level of the n-type host.

Therefore, in the n-type transition region 106, the HOMO is in a mixed state of the HOMOs of the n-type host and the p-type host, and specifically, the HOMO is highly likely to be the HOMO of the p-type host in a portion close to the light-emitting layer 102 and is more likely to be the HOMO of the n-type host in a portion closer to the n-type host layer 103. The same applies to the p-type transition region.

However, even in the presence of the n-type transition region 106 and the p-type transition region 107 as described above, at the interface between the light-emitting layer 102 and the p-type host layer 104, there is a gap between the LUMO levels, which serves as a barrier to electron transfer, and at the interface between the light-emitting layer 102 and the n-type host layer 103, there is a gap between the HOMO levels, which serves as a barrier to hole transfer. This is the same as FIG. 2A.

Figure 2A:
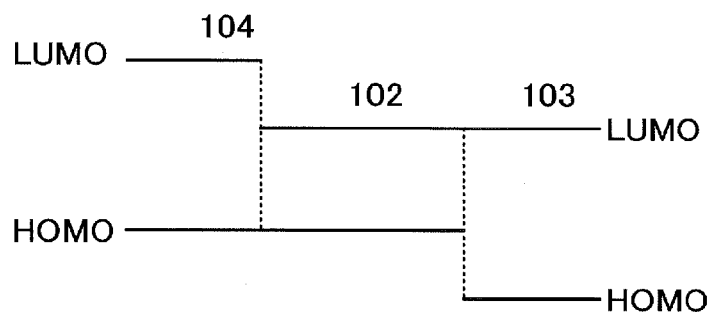
FIGS. 2A to 2D illustrate a principle of the present invention.
Figure 2B:
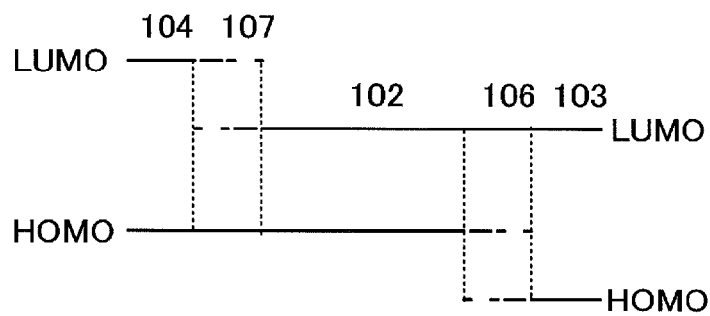

Note that an interface with a drastic concentration change as in FIG. 2A causes the problem of high likelihood of deterioration of the vicinity of the interface because electrons, for example, are likely to be concentrated at the interface. In contrast, an unclear interface as in FIG. 2B does not cause deterioration of a specific portion because electrons stay in probabilistically determined portions. In other words, it is possible to suppress deterioration of a light-emitting element, thereby increasing the reliability thereof.

On the other hand, at the interface between the light-emitting layer 102 and the p-type transition region 107 and the interface between the p-type transition region 107 and the p-type host layer 104, the HOMO levels are equal and thus there is no barrier to hole transfer, and at the interface between the light-emitting layer 102 and the n-type transition region 106 and the interface between the n-type transition region 106 and the n-type host layer 103, the LUMO levels are equal and thus there is no barrier to electron transfer.

As a result, electrons are easily transferred from the n-type host layer 103 to the light-emitting layer 102, but the gap between the LUMO levels in the p-type transition region 107 hinders electron transfer from the light-emitting layer 102 to the p-type host layer 104. Similarly, holes are easily transferred from the p-type host layer 104 to the light-emitting layer 102, but the gap between the HOMO levels in the n-type transition region 106 hinders hole transfer from the light-emitting layer 102 to the n-type host layer 103.

As a result, electrons and holes can be confined in the light-emitting layer 102. In the light-emitting element 101c in which the concentration of the n-type host and the concentration of the p-type host change continuously between the n-type host layer 103 and the p-type host layer 104, it can be similarly considered that electrons and holes can be efficiently confined between the n-type host layer 103 and the p-type host layer 104.

Next, excitation processes for the guest molecules 105 will be described. Here, the light-emitting element 101a is used as an example in the description; the same applies to the light-emitting element 101b and the light-emitting element 101c. As described above, the excitation processes include the direct recombination process and the energy transfer process.

Figure 2C:
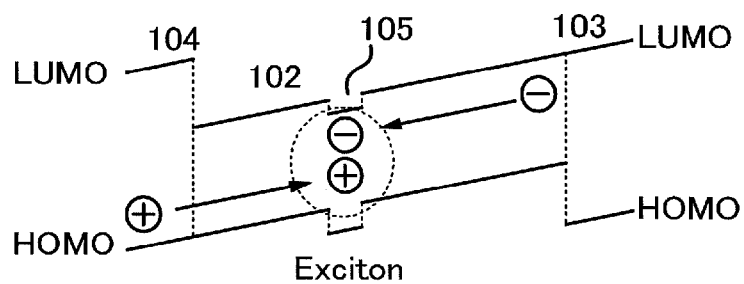

FIG. 2C illustrates the direct recombination process, where electrons are injected into the LUMO of the light-emitting layer 102 from the n-type host layer 103 connected to a cathode, and holes are injected into the HOMO of the light-emitting layer 102 from the p-type host layer 104 connected to an anode. Because guest molecules 105 exist in the light-emitting layer 102, the guest molecules can be brought into an excited state (an intramolecular exciton) by injection of electrons and holes into the LUMO and the HOMO of the guest molecules under appropriate conditions.

However, it is technically difficult to efficiently inject electrons and holes into the LUMO and the HOMO of the guest molecules that are thinly dispersed in the light-emitting layer 102; therefore, the probability of the process is not high enough. The efficiency can be increased by setting the LUMO of the guest to be lower than the LUMO of the n-type host by 0.1 eV to 0.3 eV so that the guest molecules preferentially trap electrons. A similar effect can be obtained by setting the HOMO of the guest to be higher than the HOMO of the p-type host by 0.1 eV to 0.3 eV. Note that the HOMO of the guest is lower than that of the p-type host in FIG. 2C. However, electron is efficiently trapped since the LUMO of the guest is sufficiently lower than those of the n-type host and the p-type host It is not preferable to set the LUMO of the guest to be lower than the LUMO of the n-type host by 0.5 eV or more (or to set the HOMO of the guest to be higher than the HOMO of the p-type host by 0.5 eV or more) because, although the probability of trapping electrons (holes) increases, the conductivity of the light-emitting layer 102 decreases and only the guest molecules on the cathode side (anode side) are excited locally.

Figure 2D:
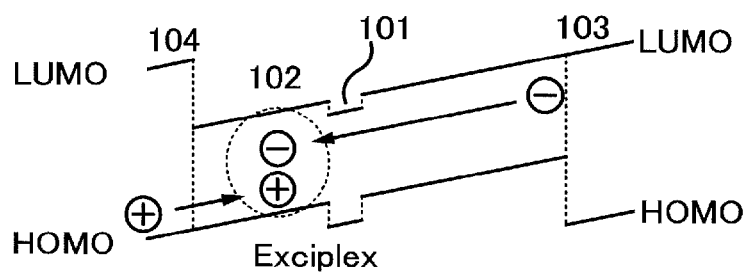

FIG. 2D illustrates exciplex formation by an appropriate selection of the n-type host and the p-type host according to the present invention. In the case where electrons and holes are injected into the light-emitting layer 102 in the manner described above, compared with the probability that electrons and holes encounter in the guest molecules, the probability that they encounter in the n-type host molecules and the p-type host molecules adjacent to each other in the light-emitting layer 102 is high. In such a case, an exciplex is formed. Here, the exciplex will be described in detail.

The exciplex is formed by an interaction between dissimilar molecules in excited states. The exciplex is generally known to be easily formed between an organic compound having a relatively deep LUMO level (an n-type host) and an organic compound having a relatively shallow HOMO level (a p-type host).

An emission wavelength of the exciplex depends on a difference in energy between the HOMO level and the LUMO level of the p-type host and the n-type host, respectively. When the energy difference is large, the emission wavelength is short. When the energy difference is small, the emission wavelength is long. When the exciplex is formed by molecules of the n-type host and the p-type host, the LUMO level and the HOMO level of the exciplex originate from the n-type host and the p-type host, respectively.

Therefore, the energy difference of the exciplex is smaller than the energy difference of the n-type host and the energy difference of the p-type host. In other words, the emission wavelength of the exciplex is longer than the emission wavelengths of the n-type host and the p-type host.

The process of the exciplex formation is considered to be roughly classified into two processes.

<<Electroplex>>

In this specification, the term "electroplex" means an exciplex which is directly formed by the n-type host in the ground state and the p-type host in the ground state. For example, an electroplex is an exciplex which is directly formed by an anion of the n-type host and a cation of the p-type host.

As described above, in the energy transfer process of the light-emission process of a conventional organic compound, an electron and a hole are recombined in a host molecule (causing excitation), and excitation energy is transferred from the host molecule in the excited state to a guest molecule, whereby the guest molecule is brought into an excited state to emit light.

At this time, before the excitation energy is transferred from the host molecule to the guest molecule, the host molecule itself might emit light or the excitation energy might turn into thermal energy, which leads to deactivation of the excitation energy. In particular, when the host molecule is in a singlet excited state, excitation lifetime is shorter than that when it is in a triplet excited state, which easily leads to deactivation of excitation energy. The deactivation of excitation energy is one of causes for deterioration and decrease in lifetime of a light-emitting element.

However, when an electroplex is formed by the n-type host molecule and the p-type host molecule having carriers (cation or anion), formation of a singlet exciton having a short excitation lifetime can be suppressed. In other words, there can be a process where an exciplex is directly formed without formation of a singlet exciton. Thus, the deactivation of singlet excitation energy of the n-type host molecule or the p-type host molecule can be inhibited. Accordingly, a light-emitting element having a long lifetime can be obtained.

It is a novel concept to obtain a light-emitting element having high emission efficiency by suppressing the generation of the singlet excited state of a host molecule and transferring energy from an electroplex formed instead to a guest molecule, in the above-described manner.

<<Formation of Exciplex by Exciton>>

As another process, there is thought to be an elementary process where one of the n-type and p-type host molecules forms a singlet exciton and then interacts with the other in the ground state to form an exciplex. Unlike an electroplex, a singlet excited state of the n-type host molecule or the p-type host molecule is temporarily generated in this case, but this is rapidly converted into an exciplex, and thus, deactivation of singlet excitation energy can be inhibited. Thus, it is possible to inhibit deactivation of excitation energy of the host molecule.

Note that when the difference between the HOMO levels of the n-type and p-type hosts and the difference between the LUMO levels of the n-type and p-type hosts are large (specifically, 0.3 eV or more), electrons are preferentially injected into the n-type host molecule and holes are preferentially injected into the p-type host molecule. In this case, it is thought that the process where an electroplex is formed takes precedence over the process where an exciplex is formed through a singlet exciton.

Note that in order to increase the efficiency of the energy transfer process, it is preferable in either Förster mechanism or Dexter mechanism described above that the overlap between the emission spectrum of an electroplex and/or an exciplex and the absorption spectrum of a guest be larger than the overlap between the emission spectrum of an n-type host (or a p-type host) alone (or the corresponding energy difference) and the absorption spectrum of the guest considering the importance of the absorption of the MLCT transition.

In addition, in order to increase the energy transfer efficiency, it is preferable to increase the concentration of the guest to such an extent as not to cause concentration quenching, and it is preferable that the concentration of the guest to the total amount of the n-type host and the p-type host be 1% to 9% by weight.

Note that regardless of whether the excitation process is the direct recombination process or the energy transfer process, a concept has not been known in which guest molecules in the n-type and p-type hosts are excited by the energy transfer from the exciplex and or electroplex of the n-type and p-type hosts to the guest molecules. In the specification, this concept is referred to as "guest coupled with complementary hosts" (GCCH). This concept not only enables the confinement of the carries and reduction in the barrier to carrier injection into the light-emitting layer simultaneously but also allows the utilization of the energy transfer process from both of the singlet and triplet excited states thereof, which leads to the formation of a highly efficient light-emitting element (i.e., power efficiency is significantly high) with a low driving voltage.

Embodiment 2

Figure 3A:
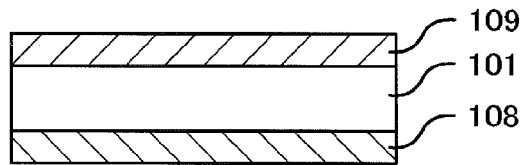
FIGS. 3A to 3E illustrate examples in an embodiment of the present invention.

FIG. 3A illustrates an example of a light-emitting device of this embodiment. The light-emitting device illustrated in FIG. 3A is that in which a light-emitting element 101 described in Embodiment 1 (such as the light-emitting element 101a, the light-emitting element 101b, or the light-emitting element 101c described in Embodiment 1) is sandwiched between a cathode 108 and an anode 109. Note that at least one of the cathode 108 and the anode 109 is preferably transparent. This light-emitting device may be provided over an appropriate substrate.

In the light-emitting element 101, the n-type host layer 103 and the p-type host layer 104 between which the light-emitting layer 102 is sandwiched function as an electron-transport layer and a hole-transport layer, respectively, and function to block holes and electrons, respectively, as described above. Thus, layers corresponding to an electron-transport layer and a hole-transport layer do not need to be additionally provided. Accordingly, the process for manufacturing the light-emitting device illustrated in FIG. 3A can be simplified.

The light-emitting element 101 includes a guest, an n-type host, and a p-type host as described in Embodiment 1. Two or more kinds of substances can be used as n-type hosts (or p-type hosts).

As the guest, an organometallic complex is preferable, and in particular, an iridium complex is preferable. In consideration of energy transfer due to Förster mechanism described above, the molar absorption coefficient of the absorption band of the phosphorescent compound which is located on the longest wavelength side is preferably 2000 $M^{-1} \cdot cm^{-1}$ or more, more preferably 5000 $M^{-1} \cdot cm^{-1}$ or more.

Examples of compounds having such a high molar absorption coefficient are bis(3,5-dimethyl-2-phenylpyrazinato)(dipivaloylmethanato)iridium(III) (abbreviation: [Ir(mppr-Me)$_2$(dpm)], see the chemical formula 1 below), (acetylacetonato)bis(4,6-diphenylpyrimidinato)iridium(III) (abbreviation: [Ir(dppm)$_2$(acac)], see the chemical formula 2 below), and the like. In particular, when a material having a molar absorption coefficient of 5000 $M^{-1} \cdot cm^{-1}$ or more, such as [Ir(dppm)$_2$(acac)], is used, a light-emitting element that can achieve an external quantum efficiency of about 30% can be obtained.

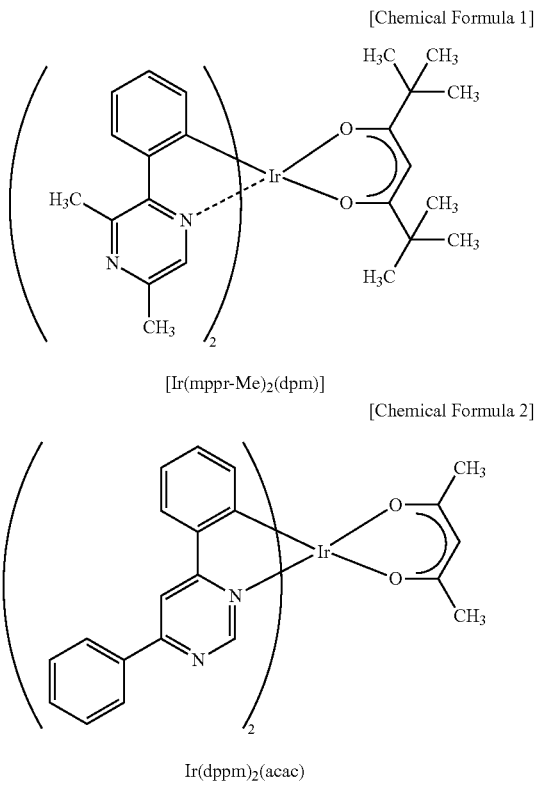

[Chemical Formula 1]

[Ir(mppr-Me)$_2$(dpm)]

[Chemical Formula 2]

Ir(dppm)$_2$(acac)

The n-type host is represented by a compound having a π-electron deficient heteroaromatic ring. That is, a compound having a 6-membered aromatic ring which has a heteroatom (nitrogen, phosphorous, etc.) with an electronegativity greater than carbon as a constituting element of the ring. For example, the n-type host may be any one of compounds having a benzoquinoxaline skeleton (benzoquinoxaline derivative) which readily accept electrons, such as 2-[3-(dibenzothiophen-4-yl)phenyl]dibenzo[f,h]quinoxaline (abbreviation: 2mDBTPDBq-II), 2-[4-(dibenzothiophen-4-yl)phenyl]dibenzo[f,h]quinoxaline (abbreviation: 2DBTPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

The p-type host is represented by an aromatic amine (a compound in which at least one aromatic ring is bonded to a nitrogen atom) or a carbazole derivative. For example, the p-type host may be any of compounds which readily accept holes, such as 4,4'-di(1-naphthyl)-4''-(9-phenyl-9H-carbazol-3-yl)triphenylamine (abbreviation: PCBNBB), 4,4'-bis[N-(1-naphthyl)-N-phenylamino]biphenyl (abbreviation: NPB or α-NPD), and 4-phenyl-4'-(9-phenyl-9H-carbazol-3-yl)triphenylamine (abbreviation: PCBA1BP). Note that the present invention is not limited to these compounds as long as the combination of the n-type host and the p-type host can form an exciplex.

The anode 109 is preferably formed using any of metals, alloys, conductive compounds, mixtures thereof, and the like which have a high work function (specifically, 4.0 eV or more). Specific examples include indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Films of these conductive metal oxides are usually formed by a sputtering method, but may be formed by application of a sol-gel method or the like.

For example, an indium oxide-zinc oxide film can be formed by a sputtering method using a target in which zinc oxide is added to indium oxide at 1 wt % to 20 wt %. An IWZO film can be formed by a sputtering method using a target in which 0.5 wt % to 5 wt % of tungsten oxide and 0.1 wt % to 1 wt % of zinc oxide are added to indium oxide. Other examples are graphene, gold, platinum, nickel, tungsten, chromium, molybdenum, iron, cobalt, copper, palladium, nitrides of metal materials (e.g., titanium nitride), and the like.

Note that when a layer included in the light-emitting element 101 and formed in contact with the anode is formed using a later-described composite material formed by combining an organic compound and an electron acceptor (an acceptor), as a substance used for the anode, any of a variety of metals, alloys, electrically conductive compounds, mixtures thereof, and the like can be used regardless of the work function; for example, aluminum, silver, an alloy containing aluminum (e.g., Al—Si), or the like can also be used. The anode can be formed by, for example, a sputtering method, an evaporation method (including a vacuum evaporation method), or the like.

The cathode 108 is preferably formed using any of metals, alloys, electrically conductive compounds, mixtures thereof, and the like which have a low work function (preferably, 3.8 eV or lower). Specific examples include elements that belong to Groups 1 and 2 in the periodic table, that is, alkali metals such as lithium and cesium, alkaline earth metals such as calcium and strontium, magnesium, alloys thereof (e.g., Mg—Ag and Al—Li), rare-earth metals such as europium and ytterbium, alloys thereof, and the like.

When a layer included in the light-emitting element 101 and formed in contact with the cathode is formed using a later-described composite material formed by combining an organic compound and an electron donor (a donor), any of a variety of conductive materials, such as Al, Ag, ITO, and indium oxide-tin oxide containing silicon or silicon oxide, can be used regardless of the work function. Note that when the cathode is formed, a vacuum evaporation method or a sputtering method can be used. In the case of using a silver paste or the like, a coating method, an inkjet method, or the like can be used.

Figure 3B:
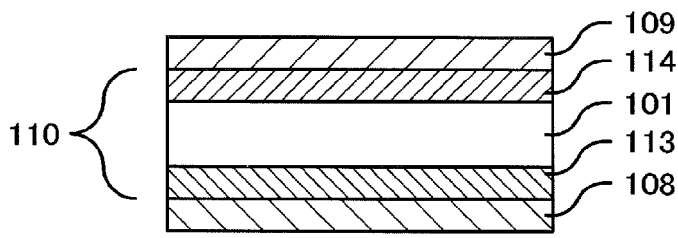

FIG. 3B illustrates an example of a light-emitting device of this embodiment. The light-emitting device illustrated in FIG. 3B is that in which an electron-injection layer 113 is provided between the light-emitting element 101 and the cathode 108 and a hole-injection layer 114 is provided between the light-emitting element 101 and the anode 109 in the light-emitting device illustrated in FIG. 3A.

When the electron-injection layer 113 and the hole-injection layer 114 are provided, electrons and holes can be efficiently injected into the light-emitting element 101 from the cathode 108 and the anode 109, whereby energy efficiency can be increased. Here, a stack of the light-emitting element 101, the electron-injection layer 113, and the hole-injection layer 114 is referred to as an EL layer 110.

The hole-injection layer 114 is a layer that contains a substance having a high hole-injection property. As the substance having a high hole-injection property, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. Alternatively, a phthalocyanine-based compound such as phthalocyanine (abbreviation: $H_2Pc$) or copper(II) phthalocyanine (abbreviation: CuPc) can be used.

Other examples of the substance which can be used are aromatic amine compounds and the like which are low molecular organic compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)-amino]-9-phenylcarbazole (abbreviation: PCzPCN1).

Still other examples of the substance which can be used are polymers (including oligomers and dendrimers), such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), and poly[N,N'-bis(4-butylphenyl)-N,N'-bis(phenyl)benzidine] (abbreviation: Poly-TPD), and polymers to which acid is added, such as poly(3,4-ethylenedioxythiophene)/poly(styrenesulfonic acid) (PEDOT/PSS) and polyaniline/poly(styrenesulfonic acid) (PAni/PSS).

For the hole-injection layer 114, the composite material formed by combining an organic compound and an electron acceptor (an acceptor) may be used. Such a composite material, in which holes are generated in the organic compound by the electron acceptor, has high hole-injection and hole-transport properties. In this case, the organic compound is preferably a material excellent in transporting the generated holes (a substance having a high hole-transport property).

Examples of the organic compound used for the composite material can be a variety of compounds, such as aromatic amine compounds, carbazole derivatives, aromatic hydrocarbons, and polymers (including oligomers and dendrimers). The organic compound used for the composite material is preferably an organic compound having a high hole-transport property, and is specifically preferably a substance having a hole mobility of $10^{-6}$ $cm^2/Vs$ or more. Note that other than these substances, any substance that has a property of transporting more holes than electrons may be used. Organic compounds that can be used for the composite material will be specifically described below.

Examples of the organic compound that can be used for the composite material are aromatic amine compounds, such as TDATA, MTDATA, DPAB, DNTPD, DPA3B, PCzPCA1, PCzPCA2, PCzPCN1,1,3,5-tri(dibenzothiophen-4-yl)benzene (abbreviation: DBT3P-II), 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), 9-phenyl-3-[4-(10-phenyl-9-anthryl)phenyl]-9H-carbazole (abbreviation: PCzPA), and 1,4-bis[4-(N-carbazolyl)-phenyl]-2,3,5,6-tetraphenylbenzene.

Other examples of the organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds such as 7,7,8,8-tetracyano-2,3,5,6-tetrafluoro-quinodimethane (abbreviation: $F_4$-TCNQ) and chloranil, oxides of transition metals such as oxides of metals that belong to Groups 4 to 8 in the periodic table, and the like. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable since it is stable in the air, has a low hygroscopic property, and is easy to handle.

The composite material may be formed using the above-described electron acceptor and the above-described polymers such as PVK, PVTPA, PTPDMA, or Poly-TPD, and may be used for the hole-injection layer 114.

The electron-injection layer 113 is a layer that contains a substance having a high electron-injection property. Examples of the substance that can be used for the electron-injection layer 113 are alkali metals, alkaline earth metals, and compounds thereof, such as lithium, cesium, calcium, lithium fluoride, cesium fluoride, calcium fluoride, and lithium oxide, and rare earth metal compounds, such as erbium fluoride.

For the electron-injection layer 113, a substance having a high electron-transport property can also be used. Examples of the substance having a high electron-transport property are metal complexes such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, $Zn(BOX)_2$, and bis[2-(2-hydroxyphenyl)benzothiazolato]zinc (abbreviation: $Zn(BTZ)_2$).

Other examples thereof are heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), 4,4'-bis(5-methylbenzoxazol-2-yl)stilbene (abbreviation: BzOs).

Still other examples are polymers such as poly(2,5-pyridine-diyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy). The substances mentioned here are mainly substances having an electron mobility of $10^{-6}$ cm$^2$/Vs or more.

Note that other than these substances, any substance that has a property of transporting more electrons than holes may be used for the electron-injection layer 113. These substances having a high electron-transport property can be used for an electron-transport layer described below.

Alternatively, a composite material formed by combining an organic compound and an electron donor (a donor) may be used for the electron-injection layer 113. Such a composite material, in which electrons are generated in the organic compound by the electron donor, has high electron-injection and electron-transport properties. The organic compound here is preferably a material excellent in transporting the generated electrons, and specifically any of the above substances (such as metal complexes and heteroaromatic compounds) for the electron-transport layer can be used.

As the electron donor, a substance showing an electron-donating property with respect to the organic compound may be used. Preferable specific examples of the electron donor are alkali metals, alkaline earth metals, and rare earth metals, such as lithium, cesium, magnesium, calcium, erbium, and ytterbium. Any of alkali metal oxides and alkaline earth metal oxides is preferable, examples of which are lithium oxide, calcium oxide, barium oxide, and the like, and a Lewis base such as magnesium oxide or an organic compound such as tetrathiafulvalene (abbreviation: TTF) can be used.

Figure 3C:
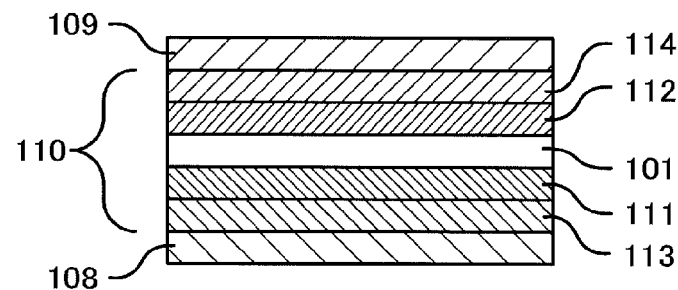

FIG. 3C illustrates an example of a light-emitting device of this embodiment. The light-emitting device illustrated in FIG. 3C is that in which an electron-transport layer 111 is provided between the light-emitting element 101 and the electron-injection layer 113 and a hole-transport layer 112 is provided between the light-emitting element 101 and the hole-injection layer 114 in the light-emitting device illustrated in FIG. 3B.

As described above, the n-type host layer 103 and the p-type host layer 104 in the light-emitting element 101 also function as an electron-transport layer and a hole-transport layer, respectively. In order to more effectively inject electrons and holes into the light-emitting element 101, it is preferable that the electron-transport layer 111 and the hole-transport layer 112 be additionally provided.

The electron-transport layer 111 is a layer that contains a substance having a high electron-transport property. For the electron-transport layer 111, the above-described substance having a high electron-transport property can be used. The electron-transport layer is not limited to a single layer, and may be a stack of two or more layers containing any of the above substances.

The hole-transport layer 112 is a layer that contains a substance having a high hole-transport property. Examples of the substance having a high hole-transport property are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ cm$^2$/Vs or more. Note that other than these substances, any substance that has a property of transporting more holes than electrons may be used. Note that the layer containing a substance having a high hole-transport property is not limited to a single layer, and may be a stack of two or more layers containing any of the above substances.

For the hole-transport layer 112, a carbazole derivative such as CBP, CzPA, or PCzPA or an anthracene derivative such as t-BuDNA, DNA, or DPAnth may be used. For the hole-transport layer 112, a high molecular compound such as PVK, PVTPA, PTPDMA, or Poly-TPD can also be used.

Note that the hole-injection layer 114, the hole-transport layer 112, the light-emitting element 101, the electron-transport layer 111, and the electron-injection layer 113 which are mentioned above can each be formed by a method such as an evaporation method (including a vacuum evaporation method), an inkjet method, or a coating method. It is to be noted that the EL layer 110 does not necessarily include all of these layers.

Figure 3D:
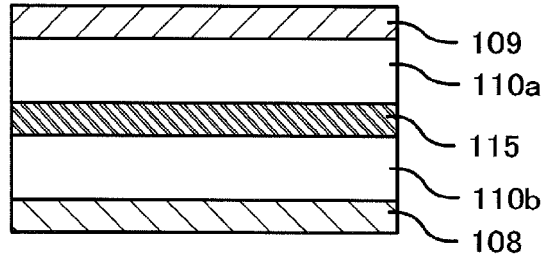

As illustrated in FIG. 3D, between the anode 109 and the cathode 108, a plurality of EL layers 110a and 110b may be stacked. In this case, the EL layers 110a and 110b each include at least the light-emitting element 101 illustrated in FIG. 3A or the EL layer 110 illustrated in FIGS. 3B and 3C. A charge-generation layer 115 is provided between the EL layer 110a and the EL layer 110b which are stacked. The charge-generation layer 115 can be formed using the substance having a high hole-injection property or the composite material described above. Further, the charge-generation layer 115 may have a stacked structure of a layer containing the composite material and a layer containing another material.

In that case, as the layer containing another material, a layer containing an electron-donating substance and a substance with a high electron-transport property, a layer formed of a transparent conductive film, or the like can be used. Moreover, a light-emitting element may have a structure in which phosphorescence is obtained from one of the EL layers and fluorescence is obtained from the other of the EL layers. This phosphorescence can be obtained by adopting the above-described structures of the EL layer.

Furthermore, by making emission colors of EL layers different, light of a desired color can be obtained from the light-emitting device as a whole. For example, the emission colors of the EL layers 110a and 110b are complementary, so that the light-emitting device can be made to emit white light as a whole. Further, the same applies to a light-emitting device having three or more EL layers.

Figure 3E:
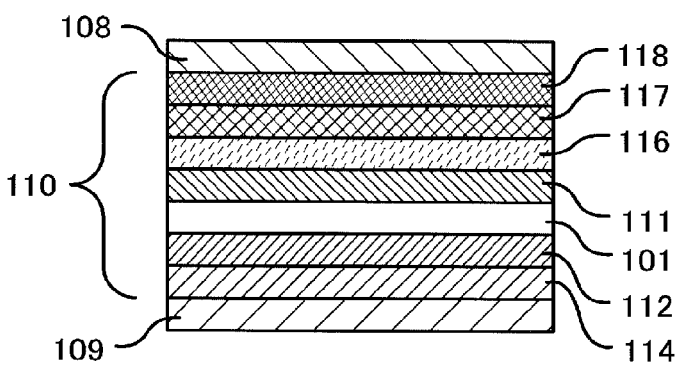

Alternatively, as illustrated in FIG. 3E, an EL layer 110 including the hole-injection layer 114, the hole-transport layer 112, the light-emitting element 101, the electron-transport layer 111, an electron-injection buffer layer 116, an electron-relay layer 117, and a composite material layer 118 which is in contact with the cathode 108, may be formed between the anode 109 and the cathode 108.

It is preferable to provide the composite material layer 118 which is in contact with the cathode 108, in which case damage caused to the EL layer 110 particularly when the cathode 108 is formed by a sputtering method can be reduced. The composite material layer 118 can be formed using the above-described composite material in which an organic compound having a high hole-transport property contains an acceptor substance.

Further, by providing the electron-injection buffer layer 116, an injection barrier between the composite material layer 118 and the electron-transport layer 111 can be reduced; thus, electrons generated in the composite material layer 118 can be easily injected into the electron-transport layer 111.

For the electron-injection buffer layer 116, a substance having a high electron-injection property, such as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate), can be used.

Further, in the case where the electron-injection buffer layer 116 contains a substance having a high electron-transport property and a donor substance, the donor substance is preferably added so that the mass ratio of the donor substance to the substance having a high electron-transport property is in the range from 0.001:1 to 0.1:1. As the substance having a high electron-transport property, a material similar to the material for the electron-transport layer 111 described above can be used.

As the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate).

Furthermore, it is preferable that the electron-relay layer 117 be formed between the electron-injection buffer layer 116 and the composite material layer 118. The electron-relay layer 117 does not necessarily need to be provided; however, by providing the electron-relay layer 117 having a high electron-transport property, electrons can be rapidly transported to the electron-injection buffer layer 116.

The structure in which the electron-relay layer 117 is sandwiched between the composite material layer 118 and the electron-injection buffer layer 116 is a structure in which the acceptor substance contained in the composite material layer 118 and the donor substance contained in the electron-injection buffer layer 116 are less likely to interact with each other, and thus their functions hardly interfere with each other. Therefore, an increase in drive voltage can be prevented.

The electron-relay layer 117 contains a substance having a high electron-transport property and is formed so that the LUMO level of the substance having a high electron-transport property is located between the LUMO level of the acceptor substance contained in the composite material layer 118 and the LUMO level of the substance having a high electron-transport property contained in the electron-transport layer 111.

In the case where the electron-relay layer 117 contains a donor substance, the donor level of the donor substance is also controlled so as to be located between the LUMO level of the acceptor substance contained in the composite material layer 118 and the LUMO level of the substance having a high electron-transport property contained in the electron-transport layer 111. As a specific value of the energy level, the LUMO level of the substance having a high electron-transport property contained in the electron-relay layer 117 is preferably higher than or equal to −5.0 eV, more preferably higher than or equal to −5.0 eV and lower than or equal to −3.0 eV.

As the substance having a high electron-transport property contained in the electron-relay layer 117, a phthalocyanine-based material or a metal complex having a metal-oxygen bond and an aromatic ligand is preferably used.

As the phthalocyanine-based material contained in the electron-relay layer 117, specifically, any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 117, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond enables the lifetime of the light-emitting device to be improved.

As the metal complex having a metal-oxygen bond and an aromatic ligand, a phthalocyanine-based material is preferable. Specifically, vanadyl phthalocyanine (VOPc), a phthalocyanine tin(IV) oxide complex (SnOPc), a phthalocyanine titanium oxide complex (TiOPc), and the like are preferable because an acceptor property is high.

Note that as the phthalocyanine-based materials mentioned above, a phthalocyanine-based material having a phenoxy group is preferable. Specifically, a phthalocyanine derivative having a phenoxy group, such as PhO-VOPc, is preferable. The phthalocyanine derivative having a phenoxy group is readily soluble in a solvent and therefore has the advantage of being easy to handle and the advantage of facilitating maintenance of an apparatus used for film formation.

The electron-relay layer 117 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 117, electrons can be transferred easily and the light-emitting device can be driven at lower voltage.

In the case where a donor substance is contained in the electron-relay layer 117, other than the materials given above as the substance having a high electron-transport property, a substance having a LUMO level higher than the acceptor level of the acceptor substance contained in the composite material layer 118 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 117 because of its high stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylene-tetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 117, the electron-relay layer 117 may be formed by a method such as co-evaporation of the substance having a high electron-transport property and the donor substance.

Note that as described above, the n-type host layer 103 and the p-type host layer 104 in the light-emitting element 101 also function as an electron-transport layer and a hole-transport layer, respectively; thus, either the electron-transport layer 111 or the hole-transport layer 112, or both, does not necessarily need to be provided. In that case, the n-type host layer 103 functions as the electron-transport layer 111.

In the above-described light-emitting device, a current flows due to a potential difference applied between the anode and the cathode and holes and electrons recombine in the EL layer 110 (or 110a or 110b), so that light is emitted. Then, this light emission is extracted to the outside through either the anode or the cathode or both. Therefore, either the anode or the cathode, or both, is an electrode having a property of transmitting visible light.

Note that a hole-blocking layer may be combined with the light-emitting element 101.

By use of the light-emitting device described in this embodiment, a passive matrix light-emitting device or an active matrix light-emitting device in which driving of the light-emitting device is controlled by a transistor can be manufactured. Furthermore, the light-emitting device can be applied to an electronic device, a lighting device, or the like.

Embodiment 3

In this embodiment, apparatuses and methods for manufacturing the light-emitting element 101a or the like described in Embodiment 1 will be described. A manufacturing apparatus illustrated in FIG. 4A includes a first evaporation source 202, a second evaporation source 203, and a third evaporation source 204 in a vacuum chamber 201. The first to third evaporation sources 202 to 204 each have a linear opening portion 223 as illustrated in FIG. 4C and allows an inside organic compound to evaporate by a resistance heating method.

Here, the first evaporation source 202, the second evaporation source 203, and the third evaporation source 204 cause the n-type host, the guest, and the p-type host to evaporate, respectively. The first to third evaporation sources 202 to 204 may each be provided with a shutter. Furthermore, it is preferable that the temperatures of the evaporation sources can be controlled independently so that the vapor pressures of the organic compounds can be controlled as appropriate. For example, the amount of evaporation of the n-type host may be set to be four times as large as the amount of evaporation of the p-type host, and the amount of evaporation of the guest may be set to be 1% of the amount of evaporation of the p-type host.

Furthermore, the opening portions 223 of the evaporation sources may have different shapes, sizes, or the like so that, for example, organic compounds are directed from the first evaporation source 202 and the third evaporation source 204 to a wide area, whereas an organic compound is directed from the second evaporation source 203 to a narrower area. Alternatively, the opening portions 223 of the evaporation sources may be oriented in different directions as illustrated in FIG. 4A.

Inside the vacuum chamber 201, one or more substrates, preferably two or more substrates (in FIG. 2A, substrates 205 to 207), may be placed and moved at an appropriate speed from left to right as illustrated (i.e., in a direction substantially perpendicular to the orientations of the opening portions 223 of the evaporation sources). Note that the evaporation sources may be at different distances from the substrates 205 to 207.

Figure 4A:
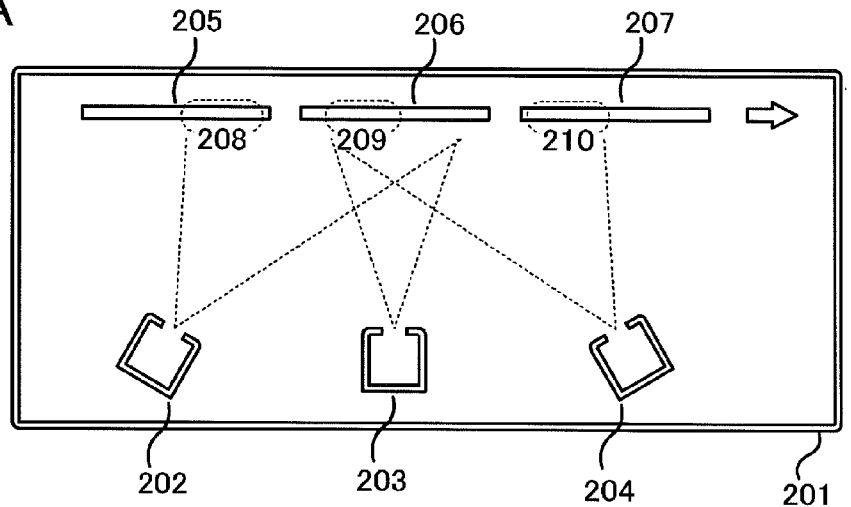
FIGS. 4A to 4C illustrate examples in an embodiment of the present invention.

In the manufacturing apparatus illustrated in FIG. 4A, in a portion denoted by reference numeral 208, the n-type host evaporated from the first evaporation source 202 is mainly deposited. In a portion denoted by reference numeral 209, the n-type host evaporated from the first evaporation source 202, the guest evaporated from the second evaporation source 203, and the p-type host evaporated from the third evaporation source 204 are deposited at a certain ratio. Furthermore, in a portion denoted by reference numeral 210, the p-type host evaporated from the third evaporation source 204 is mainly deposited.

Accordingly, while the substrates 205 to 207 are moved from left to right, the n-type host layer 103 is formed first, the light-emitting layer 102 is formed next, and the p-type host layer 104 is then formed. In some cases, the n-type transition region 106 is formed between the n-type host layer 103 and the light-emitting layer 102 and the p-type transition region 107 is formed between the p-type host layer 104 and the light-emitting layer 102, as in the light-emitting element 101b. In other cases, as in the light-emitting element 101c, a distinct boundary between the light-emitting layer and the p-type host layer or the n-type host layer is not formed.

Figure 4B:
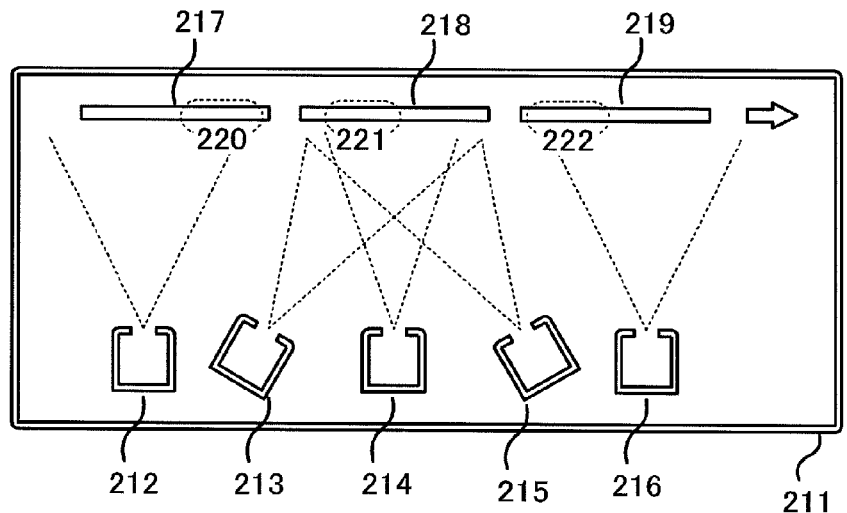
Figure 4C:
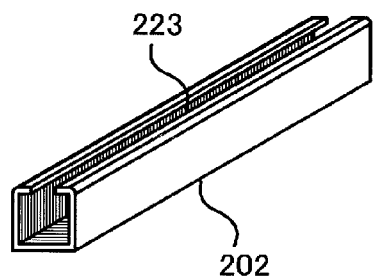

A manufacturing apparatus illustrated in FIG. 4B is obtained by modifying the manufacturing apparatus illustrated in FIG. 4A. That is, the manufacturing apparatus includes a first evaporation source 212, a second evaporation source 213, a third evaporation source 214, a fourth evaporation source 215, and a fifth evaporation source 216 in a vacuum chamber 211. Here, the first evaporation source 212 and the second evaporation source 213 cause the n-type host to evaporate; the third evaporation source 214 causes the guest to evaporate; and the fourth evaporation source 215 and the fifth evaporation source 216 cause the p-type host to evaporate.

As is the case with the manufacturing apparatus illustrated in FIG. 4A, opening portions 223 of the evaporation sources may have different shapes, sizes, or the like, may be in different positions, or may be oriented in different directions. Inside the vacuum chamber 211, one or more substrates, preferably two or more substrates (in FIG. 2B, substrates 217 to 219), may be placed and moved at an appropriate speed from left to right as illustrated.

In the manufacturing apparatus illustrated in FIG. 4B, in a portion denoted by reference numeral 220, the n-type host evaporated from the first evaporation source 212 is mainly deposited. In a portion denoted by reference numeral 221, the n-type host evaporated from the second evaporation source 213, the guest evaporated from the third evaporation source 214, and the p-type host evaporated from the fourth evaporation source 215 are deposited at a certain ratio. Furthermore, in a portion denoted by reference numeral 222, the p-type host evaporated from the fifth evaporation source 216 is mainly deposited.

The manufacturing apparatus illustrated in FIG. 4B can provide drastic concentration changes at the interface between the light-emitting layer 102 and the n-type host layer 103 and at the interface between the light-emitting layer 102 and the p-type host layer 104 as in the light-emitting element 101a.

Embodiment 4

In this embodiment, 2mDBTPDBq-II which can be used as an n-type host, PCBNBB which can be used as a p-type host, and an exciplex thereof will be described. Table 1 shows major physical properties of 2mDBTPDBq-II, PCBNBB, and [Ir(dppm)$_2$(acac)] and [Ir(mppr-Me)$_2$(dpm)] which are suitable guests when 2mDBTPDBq-II and PCBNBB are used.

TABLE 1

| Substance | LUMO Level (eV) | HOMO Level (eV) | T1 Level (eV) |
|---|---|---|---|
| 2mDBTPDBq-II | −2.78 | −5.88 | 2.54 |
| PCBNBB | −2.31 | −5.46 | 2.40 |
| [Ir(dppm)$_2$(acac)] | −2.98 | −5.56 | 2.22 |
| [Ir(mppr-Me)2(dpm)] | −2.77 | −5.50 | 2.26 |

In a region where 2mDBTPDBq-II and PCBNBB are mixed, the LUMO level is −2.78 eV and the HOMO level is −5.46 eV. These levels are equal to the LUMO level and the HOMO level of an exciplex of 2mDBTPDBq-II and PCBNBB, respectively. In addition, the LUMO level and the HOMO level of [Ir(mppr-Me)$_2$(dpm)] which is the guest are substantially at the same levels.

On the other hand, both the LUMO level and the HOMO level of [Ir(dppm)$_2$(acac)] are lower than those above; thus, it is found that [Ir(dppm)$_2$(acac)] is likely to trap electrons. This indicates that the probability of the direct recombination process is higher in the case of using [Ir(dppm)$_2$(acac)] as the guest than in the case of using [Ir(mppr-Me)$_2$(dpm)].

In addition, the energy level (T1 level) of each of [Ir(mppr-Me)$_2$(dpm)] and [Ir(dppm)$_2$(acac)] in the triplet excited state is lower than the energy level of each of 2mDBTPDBq-II and PCBNBB in the triplet excited state by 0.1 eV or more. Thus, there is a low probability that [Ir(mppr-Me)$_2$(dpm)] or [Ir(dppm)$_2$(acac)] in the triplet excited state transfers its state to the triplet excited state of 2mDBTPDBq-II or PCBNBB. In particular, the T1 level of [Ir(dppm)$_2$(acac)] is lower by 0.18 eV or more, which indicates that [Ir(dppm)$_2$(acac)] has higher emission efficiency than [Ir(mppr-Me)$_2$(dpm)].

Figure 5A:
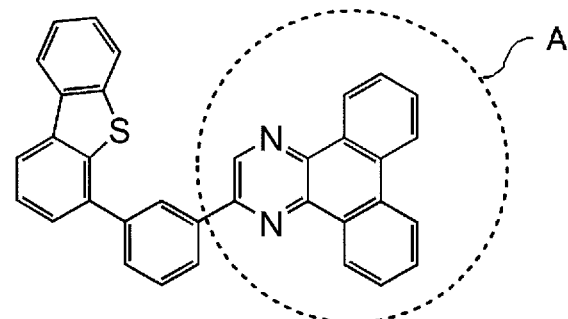
FIGS. 5A and 5B illustrate examples in an embodiment of the present invention.

FIG. 5A shows a molecular structure of 2mDBTPDBq-II. In general, when a heteroatom (i.e., an atom having higher electronegativity than carbon), such as a nitrogen atom, is introduced to constituent atoms of a six-membered aromatic ring such as a benzene ring, the heteroatom attracts π electrons on the ring and the aromatic ring tends to be deficient in electrons. In the diagram, a portion A surrounded by a dotted line corresponds to a portion which is deficient in π electrons, and this portion is likely to trap electrons. Heteroaromatic compounds comprising six-membered rings generally tend to serve as n-type hosts.

Figure 5B:
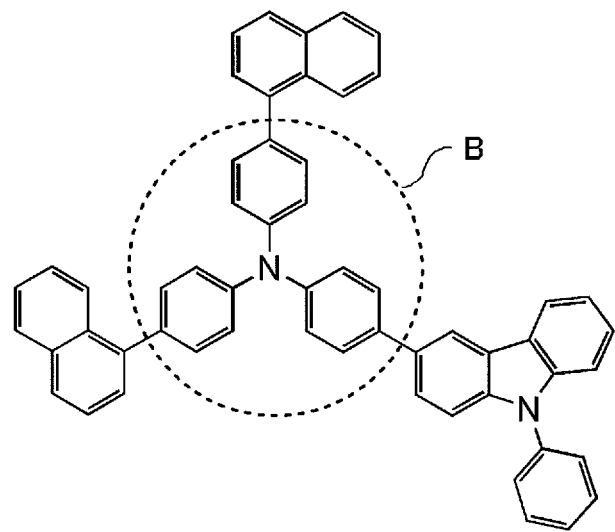

FIG. 5B shows a molecular structure of PCBNBB. In general, when a nitrogen atom, located outside an aromatic ring such as a benzene ring, is bound to the ring, the nitrogen atom donates an unshared electron pair to the benzene ring, whereby electrons become excess and tend to be released (i.e., holes are likely to be trapped). In the diagram, a portion B surrounded by a dotted line corresponds to a portion which is in excess of π electrons, and this portion is likely to release electrons (or trap holes). Aromatic amine compounds generally tend to serve as p-type hosts.

There are relatively large gaps of 0.47 eV between the LUMOs and 0.42 eV between HOMOs of 2mDBTPDBq-II and PCBNBB. These gaps serve as barriers to electrons and holes and can prevent the carriers which fail to undergo recombination from penetrating the light-emitting layer. The height of such a barrier is preferably 0.3 eV or more, further preferably 0.4 eV or more.

Whether or not the n-type host and the p-type host form an exciplex can be determined by measuring photoluminescence. When the photoluminescence spectrum of an exciplex overlaps with the absorption spectrum of the guest, it can be said that the energy transfer process due to Förster mechanism is likely to occur.

Figure 6A:
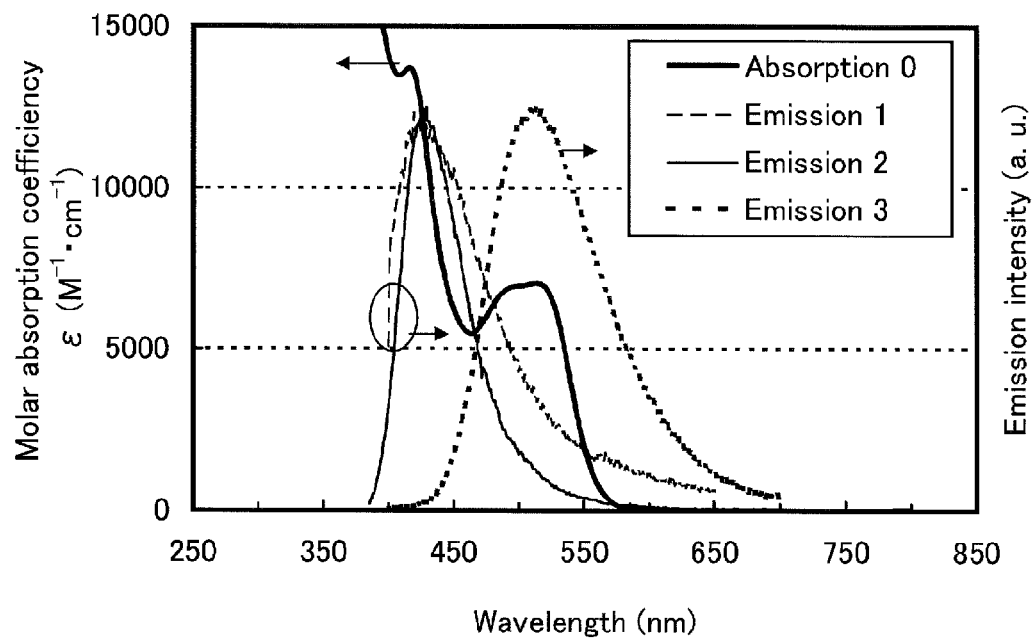
FIGS. 6A and 6B show an example in an embodiment of the present invention.
Figure 6B:
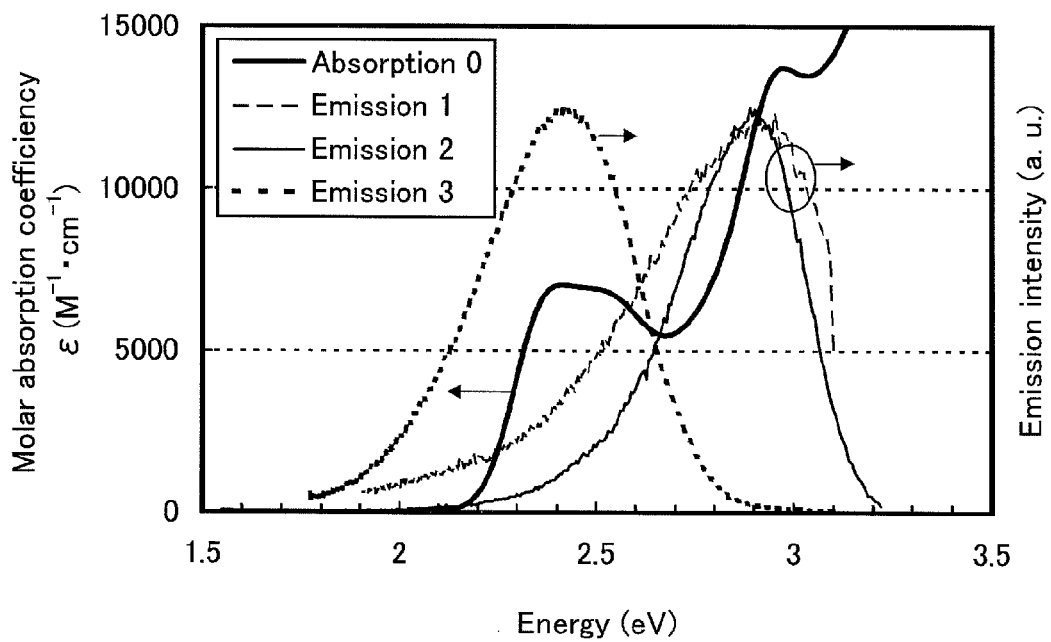

FIGS. 6A and 6B each show an ultraviolet-visible absorption spectrum (absorption spectrum 0) of a dichloromethane solution of [Ir(dppm)$_2$(acac)]. The absorption spectrum was measured at room temperature with the use of an ultraviolet-visible light spectrophotometer (V-550, manufactured by JASCO Corporation) in the state where the dichloromethane solution (0.093 mmol/L) was put in a quartz cell.

In addition, FIGS. 6A and 6B each also show a photoluminescence spectrum of a thin film of 2mDBTPDBq-II (emission spectrum 1), a photoluminescence spectrum of a thin film of PCBNBB (emission spectrum 2), and a photoluminescence spectrum of a thin film of a mixed material of 2mDBTPDBq-II and PCBNBB (emission spectrum 3). The ratio of PCBNBB to 2mDBTPDBq-II in the thin film of the mixed material was 0.8:0.2.

In FIG. 6A, the horizontal axis represents wavelength (nm), and the vertical axes represent molar absorption coefficient ε ($M^{-1}·cm^{-1}$) and emission intensity (arbitrary unit). In FIG. 6B, the horizontal axis represents energy (eV), and the vertical axes represent molar absorption coefficient ε ($M^{-1}·cm^{-1}$) and emission intensity (arbitrary unit).

As can be seen from the absorption spectrum 0 in FIG. 6A, [Ir(dppm)$_2$(acac)] has a broad absorption band at around 520 nm. This absorption band is considered to greatly contribute to light emission.

The emission spectrum 3 peaks at a longer wavelength (lower energy) than the emission spectra 1 and 2. In addition, the peak of the emission spectrum 3 is closer to the absorption band of [Ir(dppm)$_2$(acac)] and than the peaks of the emission spectra 1 and 2. Specifically, the difference between the peak of the absorption spectrum 0 of [Ir(dppm)$_2$(acac)] and the peak of the emission spectrum 3 is 0.02 eV.

It is found that the emission spectrum of the mixed material of 2mDBTPDBq-II and PCBNBB peaks at a longer wavelength (lower energy) than the emission spectrum of either organic compound alone. This indicates that an exciplex is formed by mixing 2mDBTPDBq-II with PCBNBB. In addition, no emission peak originating from 2mDBTPDBq-II or PCBNBB alone is observed, which means that even if 2mDBTPDBq-II and PCBNBB are separately excited, they immediately form an exciplex.

The peak of the emission spectrum of the mixed material has a large overlap with the absorption band in the absorption spectrum 0 of [Ir(dppm)$_2$(acac)] which is considered to greatly contribute to light emission. This suggests that a light-emitting element including 2mDBTPDBq-II, PCBNBB, and [Ir(dppm)$_2$(acac)] has high efficiency in energy transfer from an exciplex to a guest molecule.

Example 1

In this example, a light-emitting element of one embodiment of the present invention was manufactured and its performance was evaluated. In the light-emitting element of this example, 2 DBTPDBq-II is used as an n-type host and PCBA1BP is used as a p-type host.

The light-emitting element manufactured in this example has a layered structure of a cathode, an electron-injection layer, an electron-transport layer, a first layer (an n-type host layer), a light-emitting layer (a layer containing both the n-type host and the p-type host), a second layer (a p-type host layer), a hole-injection layer, and an anode in this order from above toward a substrate.

Chemical formulae (structural formulae) of materials used in this example, including those mentioned above, are shown below. Note that the chemical formulae of the materials already described above are omitted.

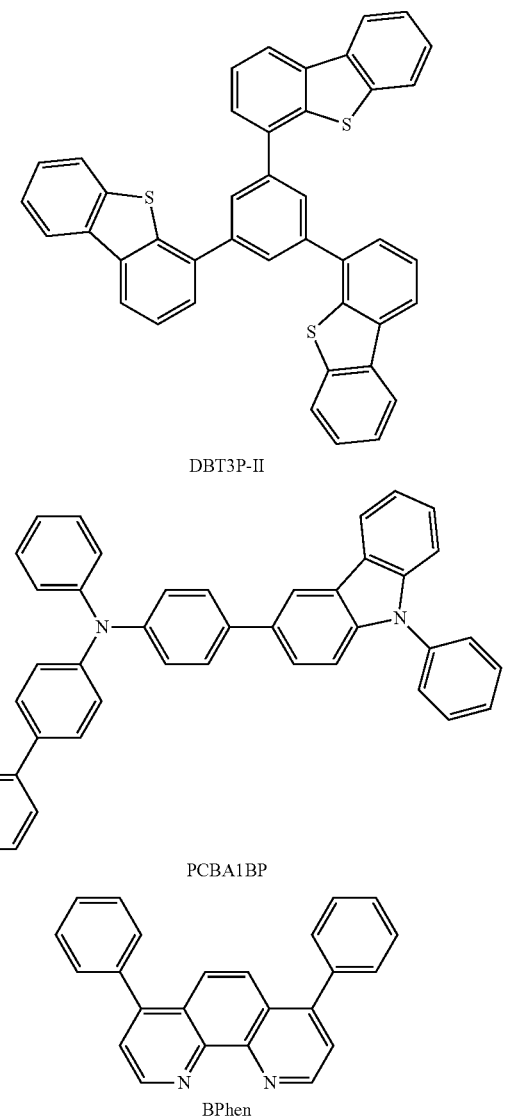

DBT3P-II

PCBA1BP

BPhen

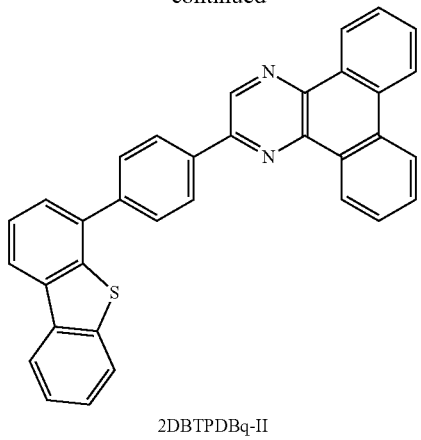

2DBTPDBq-II

A method for manufacturing the light-emitting element of this example will be described below. First, a film of indium tin oxide containing silicon oxide (ITSO) was formed over a glass substrate by a sputtering method, so that the anode was formed. Note that the thickness was set to 110 nm and the electrode area was set to 2 mm×2 mm.

Next, as pretreatment for forming the light-emitting element over the substrate, UV ozone treatment was performed for 370 seconds after washing of a surface of the substrate with water and baking that was performed at 200° C. for one hour. After that, the substrate was transferred into a vacuum evaporation apparatus where the pressure had been reduced to approximately $10^{-4}$ Pa, and was subjected to vacuum baking at 170° C. for 30 minutes in a heating chamber of the vacuum evaporation apparatus, and then the substrate was cooled down for about 30 minutes.

Next, the substrate provided with the anode was fixed to a substrate holder in the vacuum evaporation apparatus so that a surface on which the anode was provided faced downward. Then, DBT3P-II and molybdenum(VI) oxide were co-evaporated to form the hole-injection layer over the anode under a reduced pressure of approximately $10^{-4}$ Pa. The thickness of the hole-injection layer was set to 40 nm, and the weight ratio of DBT3P-II to molybdenum oxide was adjusted to 4:2 (=DBT3P-II:molybdenum oxide).

Next, over the hole-injection layer, the second layer of PCBA1BP was formed to a thickness of 20 nm by an evaporation method.

Furthermore, PCBA1BP, 2 DBTPDBq-II, and [Ir(dppm)$_2$(acac)] were co-evaporated to form the light-emitting layer over the second layer. Here, the weight ratio of 2 DBTPDBq-II to PCBA1BP and [Ir(dppm)$_2$(acac)] was adjusted to 0.8:0.2:0.05. The thickness of the light-emitting layer was set to 40 nm.

Further, over the light-emitting layer, a film of 2 DBTP-DBq-II was formed to a thickness of 10 nm by an evaporation method to form the first layer.

Next, over the first layer, a film of bathophenanthroline (abbreviation: BPhen) was formed to a thickness of 20 nm to form the electron-transport layer.

Further, over the electron-transport layer, a film of lithium fluoride (LiF) was formed by evaporation to a thickness of 1 nm to form the electron-injection layer.

Lastly, an aluminum film was formed by evaporation to a thickness of 200 nm as the cathode. Thus, the light-emitting element was manufactured. Note that, in all the above evaporation steps, evaporation was performed by a resistance-heating method. Table 2 shows the element structure of the light-emitting element obtained as described above.

TABLE 2

| Anode | Hole-injection layer | Second layer | Light-emitting layer |
|---|---|---|---|
| ITSO | DBT3P-II:MoO$_x$ (4:2) | PCBA1BP | 2DBTPDBq-II:PCBA1BP: [Ir(dppm)$_2$(acac)] (0.8:0.2:0.05) |
| 110 nm | 40 nm | 20 nm | 40 nm |

| First layer | Electron-transport layer | Electron-injection layer | Cathode |
|---|---|---|---|
| 2DBTPDBq-II | BPhen | LiF | Al |
| 10 nm | 20 nm | 1 nm | 200 nm |

In a glove box containing a nitrogen atmosphere, the light-emitting element was sealed so as not to be exposed to air. Then, operation characteristics of the light-emitting element were measured. Note that the measurements were carried out at room temperature (in the atmosphere kept at 25° C.).

Figure 7A:
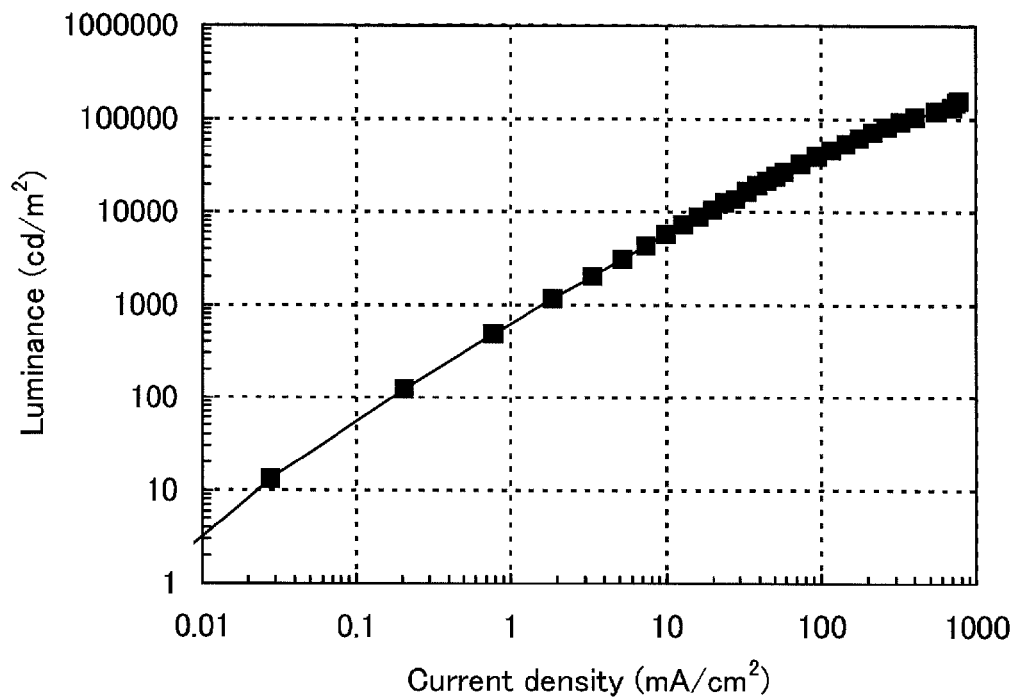
FIGS. 7A to 7C show characteristics of a light-emitting element obtained in Example 1.
Figure 7B:
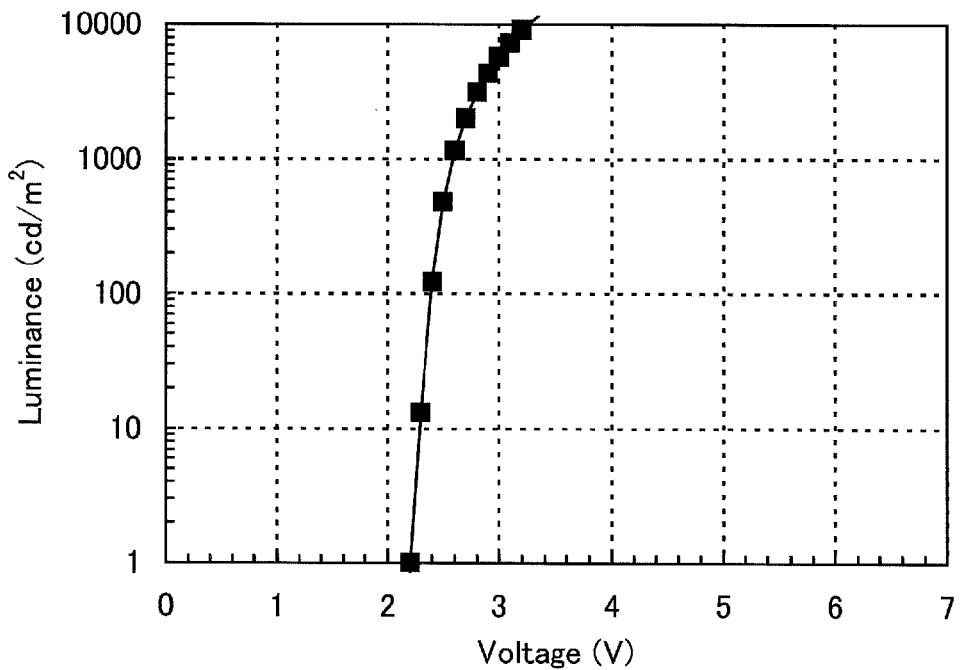
Figure 7C:
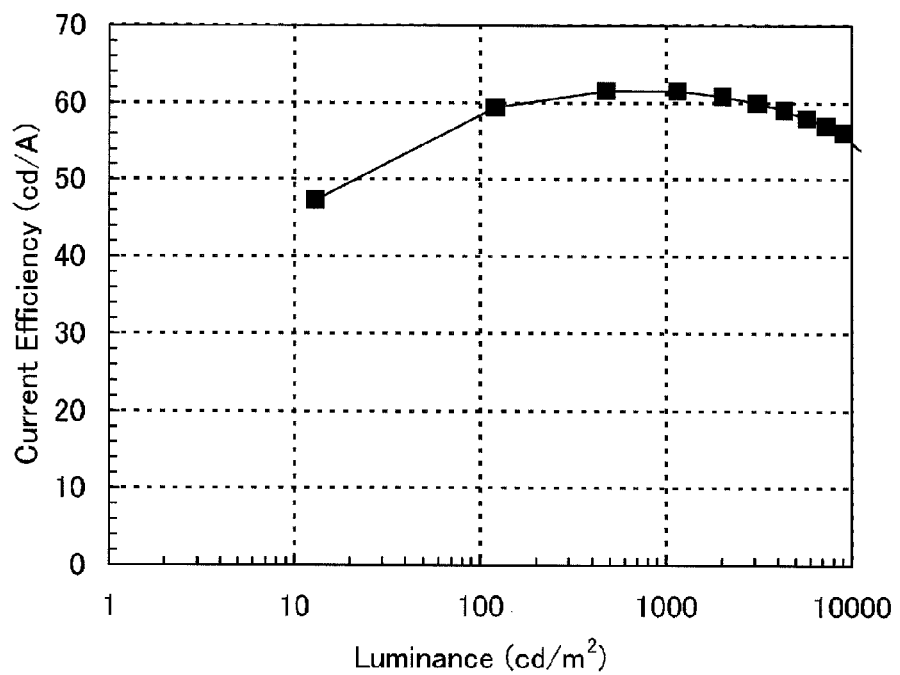

FIG. 7A shows the current density dependence of the luminance of the obtained light-emitting element, FIG. 7B shows the voltage dependence of the luminance, and FIG. 7C shows the luminance dependence of the current efficiency. Table 3 shows major characteristics of the obtained light-emitting element. The voltage required to obtain luminance of approximately 1000 cd/m$^2$ is extremely low (2.6 V). The obtained light-emitting element has a power efficiency of 70% or more and is highly efficient.

TABLE 3

| Voltage (V) | Current density (mA/cm$^2$) | Chromaticity coordinates (x, y) | Luminance (cd/m$^2$) | Current efficiency (cd/A) |
|---|---|---|---|---|
| 2.6 | 1.88 | (0.56, 0.44) | 1154 | 61.5 |

| Power efficiency (lm/W) | External quantum efficiency (%) | Energy efficiency (%) |
|---|---|---|
| 74.3 | 24.5 | 19.3 |

Example 2

In this example, a light-emitting element of one embodiment of the present invention was manufactured and measured. In this example, the light-emitting element was manufactured using 2mDBTPDBq-II as an n-type host and PCBA1BP as a p-type host.

The light-emitting element manufactured in this example has the same layered structure as the light-emitting element of Example 1. The materials already described above were used. Furthermore, a manufacturing method is similar to that in Example 1 except that the n-type host is different (i.e., 2 DBTPDBq-II of Example 1 is simply replaced with 2mDBT-PDBq-II); thus, the details are omitted here. Note that a structure of 2mDBTPDBq-II is shown below.

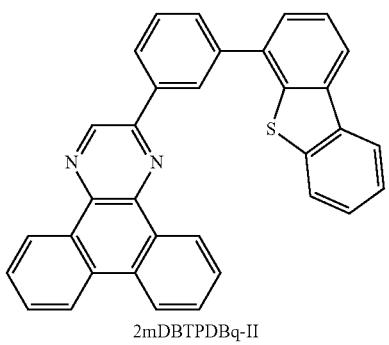 [SMILES: c1cc(-c2cnc3c4ccccc4c4ccccc4c3n2)cc(-c2cccc3c2sc2ccccc23)c1]

2mDBTPDBq-II

Table 4 shows the element structure of the obtained light-emitting element.

TABLE 4

| Anode | Hole-injection layer | Second layer | Light-emitting layer |
|---|---|---|---|
| ITSO | DBT3P-II:MoOx (4:2) | PCBA1BP | 2mDBTPDBq-II:PCBA1BP: [Ir(dppm)$_2$(acac)] (0.8:0.2:0.05) |
| 110 nm | 40 nm | 20 nm | 40 nm |

| First layer | Electron-transport layer | Electron-injection layer | Cathode |
|---|---|---|---|
| 2mDBTPDBq-II | BPhen | LiF | Al |
| 10 nm | 20 nm | 1 nm | 200 nm |

Figure 8A:
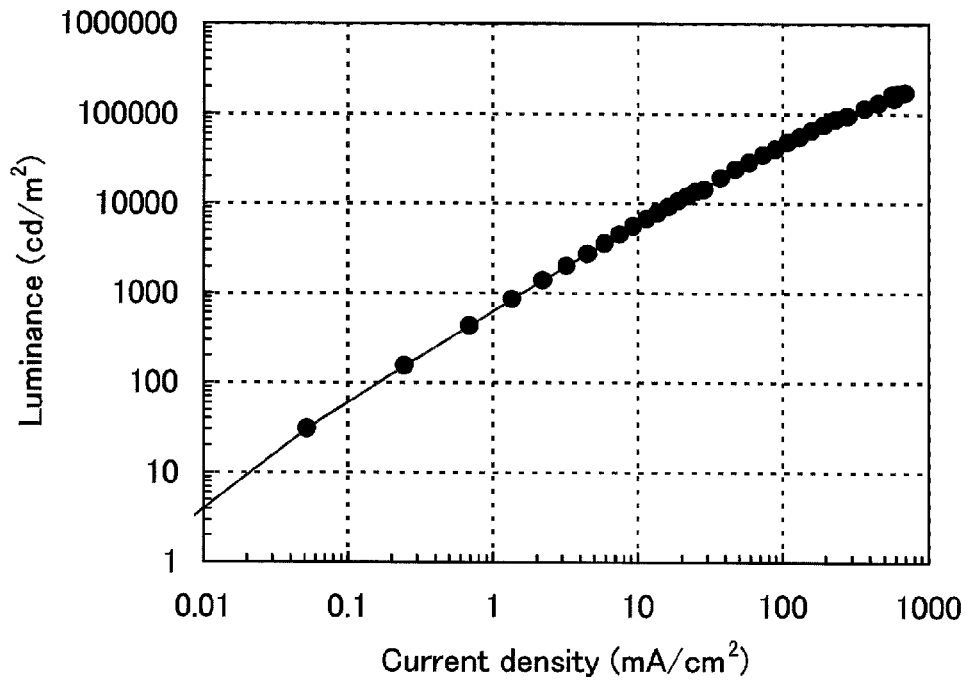
FIGS. 8A to 8C show characteristics of a light-emitting element obtained in Example 2
Figure 8B:
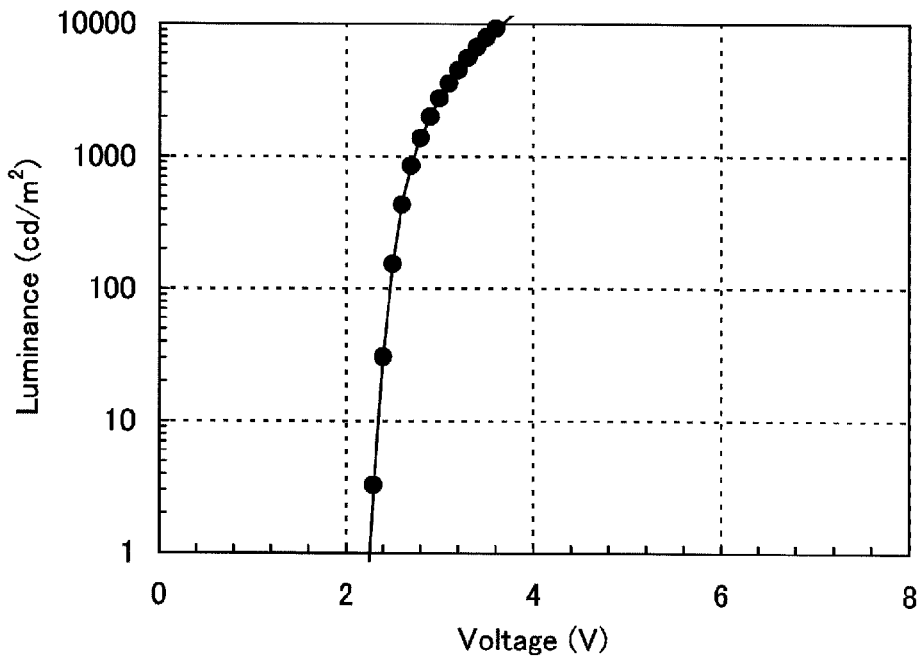
Figure 8C:
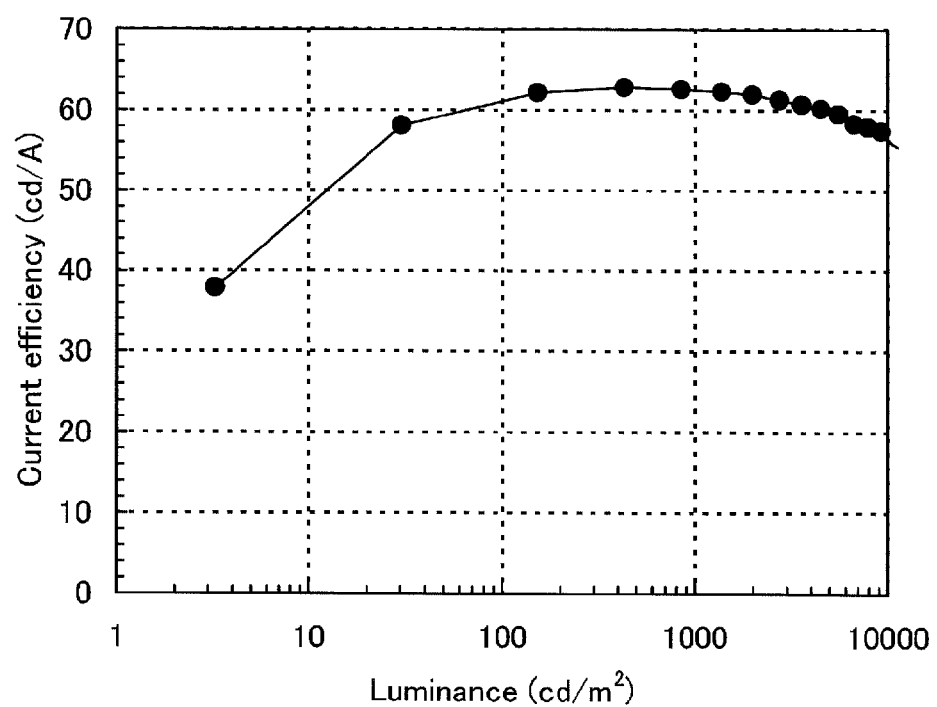

FIG. 8A shows the current density dependence of the luminance of the obtained light-emitting element, FIG. 8B shows the voltage dependence of the luminance, and FIG. 8C shows the luminance dependence of the current efficiency. Table 5 shows major characteristics of the obtained light-emitting element. The voltage required to obtain luminance of approximately 1000 cd/m$^2$ is extremely low (2.7 V). The obtained light-emitting element has an external quantum efficiency of 25% or more and is highly efficient. It has been recognized that the upper limit of the external quantum efficiency of the traditional light-emitting elements is approximately 20% owing to the light extraction efficiency. However, the concept of GCCH allows the formation of a light-emitting element with an external quantum efficiency over 25%.

TABLE 5

| Voltage (V) | Current density (mA/cm$^2$) | Chromaticity coordinates (x, y) | Luminance (cd/m$^2$) | Current efficiency (cd/A) |
|---|---|---|---|---|
| 2.7 | 1.35 | (0.57, 0.43) | 845 | 62.6 |

| Power efficiency (lm/W) | External quantum efficiency (%) | Energy efficiency (%) |
|---|---|---|
| 72.9 | 25.5 | 19.3 |

EXPLANATION OF REFERENCE

101: light-emitting element, 101a: light-emitting element, 101b: light-emitting element, 101c: light-emitting element, 102: light-emitting layer, 103: n-type host layer, 104: p-type host layer, 105: guest molecule, 106: n-type transition region, 107: p-type transition region, 108: cathode, 109: anode, 110: EL layer, 110a: EL layer, 110b: EL layer, 111: electron-transport layer, 112: hole-transport layer, 113: electron-injection layer, 114: hole-injection layer, 115: charge-generation layer, 116: electron-injection buffer layer, 117: electron-relay layer, 118: composite material layer, 201: vacuum chamber, 202: first evaporation source, 203: second evaporation source, 204: third evaporation source, 205: substrate, 206: substrate, 207: substrate, 211: vacuum chamber, 212: first evaporation source, 213: second evaporation source, 214: third evaporation source, 215: fourth evaporation source, 216: fifth evaporation source, 217: substrate, 218: substrate, 219: substrate, and 223: opening portion.

This application is based on Japanese Patent Application serial no. 2011-074272 filed with Japan Patent Office on Mar. 30, 2011, the entire contents of which are hereby incorporated by reference.

The invention claimed is:
1. A light-emitting element comprising:
a first electrode;
a first EL layer over the first electrode;
a charge-generation layer over the first EL layer;
a second EL layer over the charge-generation layer, and
a second electrode over the second EL layer,
wherein at least one of the first EL layer and the second EL layer comprises:
a first layer containing a first organic compound;
a second layer containing a second organic compound; and
a light-emitting layer interposed between the first layer and the second layer, the light-emitting layer containing a phosphorescent compound, the first organic compound, and the second organic compound, and
wherein the first organic compound and the second organic compound are selected so that an exciplex is formed therebetween, and
wherein the phosphorescent compound is an organometallic complex whose absorption originating from a triplet metal-to-ligand charge transfer transition overlaps with an emission of the exciplex.
2. The light-emitting element according to claim 1, wherein the first organic compound has a hole-transport property.
3. The light-emitting element according to claim 1, wherein the second organic compound has an electron-transport property.
4. The light-emitting element according to claim 1, wherein the phosphorescent compound contains iridium.
5. The light-emitting element according to claim 1, wherein the first organic compound is an aromatic amine or a carbazole derivative.
6. The light-emitting element according to claim 1, wherein the second organic compound has a 7-electron deficient heteroaromatic ring.
7. The light-emitting element according to claim 6, wherein the π-electron deficient heteroaromatic ring is a 6-membered ring having, as a constituting element of the ring, an element whose electronegativity is greater than that of carbon.
8. The light-emitting element according to claim 6, wherein the π-electron deficient heteroaromatic ring is benzoquinoxaline.
9. The light-emitting element according to claim 1, wherein the other one of the first EL layer and the second EL layer emits fluorescence.

10. The light-emitting element according to claim 1,
wherein the other one of the first EL layer and the second EL layer emits phosphorescence.

11. The light-emitting element according to claim 1,
wherein the first layer further contains the second organic compound, and
wherein, in the first layer, a concentration of the second organic compound changes in a direction from the first electrode to the light-emitting layer.

12. The light-emitting element according to claim 1,
wherein the second layer further contains the first organic compound, and
wherein, in the second layer, a concentration of the first organic compound changes in a direction from the second electrode to the light-emitting layer.

13. The light-emitting element according to claim 1,
wherein, in the light-emitting layer, a concentration of the first organic compound and a concentration of the second organic compound change in a direction from the first layer to the second layer.

14. An electronic device comprising the light-emitting element according to claim 1.

15. A lighting device comprising the light-emitting element according to claim 1.

* * * * *